United States Patent
Ueno et al.

(10) Patent No.: US 7,601,983 B2
(45) Date of Patent: Oct. 13, 2009

(54) TRANSISTOR AND METHOD OF MANUFACTURING THE SAME

(75) Inventors: Tetsuji Ueno, Suwon-si (KR); Hwa-Sung Rhee, Seongnam-si (KR); Ho Lee, Cheonan-si (KR); Dong-Suk Shin, Yongin-si (KR); Seung-Hwan Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 8 days.

(21) Appl. No.: 11/207,703

(22) Filed: Aug. 19, 2005

(65) Prior Publication Data

US 2006/0038230 A1   Feb. 23, 2006

Related U.S. Application Data

(63) Continuation-in-part of application No. 11/071,018, filed on Mar. 3, 2005, now abandoned.

(30) Foreign Application Priority Data

| Aug. 20, 2004 | (KR) | .............. 10-2004-0065736 |
| Jul. 13, 2005 | (KR) | .............. 10-2005-0063072 |

(51) Int. Cl.
*H01L 29/10* (2006.01)

(52) U.S. Cl. ................ 257/51; 257/64; 257/217; 257/E21.431; 257/E29.004

(58) Field of Classification Search ............... 438/149, 438/151, 150, 198, 300, 424, 429, 478, 481, 438/524, 607, 705, FOR. 237, FOR. 251, 438/FOR. 252, FOR. 277, 483, 604, 673; 257/213, 327, 628, E21.562, E21.461, E21.33, 257/18–20, 51, 64, 202, 217, 623, E21.431, 257/E29.004, E29.024

See application file for complete search history.

(56) References Cited

U.S. PATENT DOCUMENTS 4,898,835 A * 2/1990 Cawlfield ............. 438/273

(Continued)

FOREIGN PATENT DOCUMENTS

| CN | 1902736 | 1/2007 |
| JP | 11-163343 | 6/1999 |
| KR | 01-80432 | 8/2001 |
| KR | 2002-0091886 | 12/2002 |
| KR | 03-82820 | 10/2003 |
| WO | 00/30169 | 5/2000 |

OTHER PUBLICATIONS

Chinese Office Action dated Apr. 10, 2009 issued in corresponding Chinese Patent Application No. 200510119980.8.

*Primary Examiner*—Michelle Estrada
*Assistant Examiner*—Quovaunda Jefferson
(74) *Attorney, Agent, or Firm*—Mills & Onello, LLP

(57) ABSTRACT

A transistor includes a semiconductor substrate that has a first surface of a {100} crystal plane, a second surface of the {100} crystal plane having a height lower than that of the first surface, and a third surface of a {111} crystal plane connecting the first surface to the second surface. First heavily doped impurity regions are formed under the second surface. A gate structure is formed on the first surface. An epitaxial layer is formed on the second surface and the third surface. Second heavily doped impurity regions are formed at both sides of the gate structure. The second heavily doped impurity regions have side faces of the {111} crystal plane so that a short channel effect generated between the impurity regions may be prevented.

19 Claims, 38 Drawing Sheets

U.S. PATENT DOCUMENTS

| | | |
|---|---|---|
| 5,323,053 A | 6/1994 | Luryi et al. |
| 5,427,964 A | 6/1995 | Kaneshiro et al. |
| 5,620,912 A | 4/1997 | Hwang et al. |
| 6,121,100 A | 9/2000 | Andideh et al. |
| 6,271,095 B1 * | 8/2001 | Yu .............................. 438/302 |
| 6,342,421 B1 | 1/2002 | Mitani et al. |
| 6,406,973 B1 | 6/2002 | Lee ............................ 438/416 |
| 6,599,803 B2 | 7/2003 | Weon et al. ................... 438/300 |
| 6,605,498 B1 | 8/2003 | Murthy et al. ............... 438/197 |
| 6,621,131 B2 | 9/2003 | Murthy et al. |
| 6,887,762 B1 | 5/2005 | Murthy et al. |
| 7,045,407 B2 * | 5/2006 | Keating et al. .............. 438/198 |
| 2005/0026367 A1 | 2/2005 | Streck et al. ................. 438/259 |
| 2005/0148147 A1 | 7/2005 | Keating et al. |

* cited by examiner

TRANSISTOR AND METHOD OF MANUFACTURING THE SAME

CROSS REFERENCE TO RELATED APPLICATION

This application is a Continuation-In-Part of U.S. patent application Ser. No. 11/071,018, entitled "TRANSISTOR AND METHOD OF MANUFACTURING THE SAME", filed on Mar. 3, 2005 now abandoned. This application also claims priority under 35 USC § 119 to Korean Patent Application Nos. 2004-65736, filed on Aug. 20, 2004, and 2005-63072, filed on Jul. 13, 2005. The contents of all of these documents are herein incorporated by reference in their entirety for all purposes.

BACKGROUND OF THE INVENTION

1. Field of the Invention

The present invention relates to a transistor and a method of manufacturing the transistor. More particularly, the present invention relates to a highly integrated transistor that includes improved impurity regions, and a method of manufacturing the transistor.

2. Description of the Related Arts

In general, a transistor of a semiconductor device includes a gate structure formed on a semiconductor substrate, and source/drain regions provided at portions of the substrate adjacent to both sides of the gate structure. The gate structure includes a gate insulation layer pattern formed on the substrate, a conductive layer pattern formed on the gate insulation layer pattern, a hard mask layer pattern formed on the conductive layer pattern, and spacers formed on sidewalls of the conductive layer pattern.

The conductive layer pattern selectively forms a channel region in the substrate, which electrically connects the source region to the drain region. The source region provides carriers to the channel region, whereas the drain region discharges the carriers provided from the source region.

In the conventional transistor, an interface between the source/drain regions and the substrate may be damaged due to a hot carrier effect caused by rapid electrons. To prevent the hot carrier effect, there is provided a method of forming source/drain regions having lightly doped drain (LDD) structures. However, in a process for forming the LDD structures, impurities may diffuse into the substrate to thereby reduce a width of the channel region while the impurities are thermally treated to form the source/drain regions. As a semiconductor device has been highly integrated, the width of the channel region has been additionally reduced. This is referred to as a short channel effect. When the width of the channel region is reduced, a depletion layer adjacent to the source region may be electrically connected to a depletion layer adjacent to the drain region so that punch-through may occur in the transistor. Punch-through is a phenomenon in which the carriers move between the source region and the drain region through the channel region although a threshold voltage is not applied to the conductive layer pattern. When punch-through occurs in the transistor, the transistor may fail completely.

To prevent the short channel effect in the LDD structures, a method of forming a semiconductor device having a single drain cell structure is disclosed in U.S. Pat. No. 6,599,803 and U.S. Pat. No. 6,605,498. According to the method disclosed in the above U.S. Patents, recesses are formed at both sides of a gate electrode. Epitaxial layers including silicon-germanium grow in the recesses to form the single drain cell structure. In addition, a method of forming a semiconductor device is disclosed in Korean Patent Laid Open Publication No. 2003-82820. According to the method disclosed in the above Korean Patent Laid Open Publication, trenches are formed at both sides of a gate electrode. Spacers including insulating material are formed in the trenches under sidewalls of the gate electrode.

The above-mentioned conventional methods of forming a transistor having the single drain cell structure may have some advantages such as a relatively low resistance, a steep PN junction, a reduced thermal budget, etc. Thus, the conventional methods of forming a transistor may be employed for a transistor having a gate width of below about 100 nm.

However, the transistor formed by the conventional methods still has characteristics that can be improved upon, such as a lower resistance, more steep PN junctions, etc. Therefore, the conventional method may not be easily employed for a highly integrated transistor having a gate width of below about 10 nm.

SUMMARY OF THE INVENTION

The present invention provides a highly integrated transistor including an improved structure that has excellent electrical characteristics.

The present invention also provides a method of forming the transistor.

In accordance with one aspect of the present invention, there is provided a transistor including a semiconductor substrate that has a first surface of a {100} crystal plane, a second surface of the {100} crystal plane having a height lower than that of the first surface, and a third surface of a {111} crystal plane connecting the first surface to the second surface. A gate structure is formed on the first surface. An epitaxial layer is formed on the second surface and the third surface. Impurity regions are formed adjacent to both sides of the gate structure.

According to one embodiment of the present invention, the impurity regions have side faces substantially corresponding to the third surface of the semiconductor substrate. Alternatively, each impurity region may have a side face disposed between a central portion of the gate structure and the third surface of the semiconductor substrate.

According to another embodiment of the present invention, a halo implantation region is formed at a portion of the semiconductor substrate that makes contact with the third surface of the semiconductor substrate. The halo implantation region prevents impurities doped into the impurity regions from diffusing into the semiconductor substrate.

In accordance with another aspect of the present invention, there is provided a transistor including a semiconductor substrate that has a first surface of a {100} crystal plane, two second surfaces of the {100} crystal plane positioned at both sides of the first surface, and two third surfaces of a {111} crystal plane connecting the first surface to the second surfaces, respectively. The second surfaces have heights lower than that of the first surface. A gate structure is formed on the first surface. Two epitaxial layers are formed on the second surfaces and the third surfaces, respectively. Two impurity regions are formed in the epitaxial layers, respectively.

In one embodiment, spacing members are formed on sidewalls of the gate pattern, respectively. In one embodiment, the third surfaces are beneath the spacing members. The epitaxial layers can comprise silicon-germanium.

In one embodiment, the impurity regions comprise side faces, and the impurity regions comprise side faces between the third surfaces of the semiconductor substrate and a central portion of the gate structure. The impurity regions can be doped with carbon, boron or phosphorous.

The transistor can further include halo implantation regions respectively formed at portions of the semiconductor substrate that make contact with the third surfaces of the semiconductor substrate, the halo implantation regions preventing impurities in the impurity regions from diffusing into the semiconductor substrate. The halo implantation regions can comprise conductivity types substantially different from those of the impurity regions.

In one embodiment, the epitaxial layers comprise first crystalline structures growing from the third surfaces of the {111} crystal plane in a [111] direction, and second crystalline structures growing from the second surfaces of the {100} crystal plane in a [100] direction.

The epitaxial layers can comprise surfaces higher than the first surface of the semiconductor substrate.

In accordance with still another aspect of the present invention, there is provided a method of manufacturing a transistor. In the method of manufacturing the transistor, there is provided a semiconductor substrate including a first surface of a {100} crystal plane, a second surface of the {100} crystal plane having a height lower than that of the first surface, and a third surface of a {111} crystal plane connecting the first surface to the second surface. A gate structure is formed on the first surface. An epitaxial layer grows on the second surface and the third surface. Impurities are implanted into the epitaxial layer to form impurity regions.

In one embodiment, forming the gate structure comprises: forming a gate insulation layer pattern on the first surface; and forming a conductive pattern on the gate insulation layer pattern.

The method can further comprise forming a hard mask layer pattern on the conductive layer pattern.

The method can further comprise forming a spacing member on a sidewall of the conductive layer pattern. The third surface can be positioned beneath the spacing member. Forming the spacing member can comprise: forming a first spacer on the sidewall of the conductive layer pattern; and forming a second spacer on the first spacer. The first and second spacers can comprise a substantially identical material. The first and second spacers comprise a nitride.

In one embodiment, the second surface and the third surface are formed by partially etching the semiconductor substrate. The semiconductor substrate can be partially etched using an etching gas that includes HCl and at least one of $GeH_4$, $SiH_4$ and $SiH_2Cl_2$. The semiconductor substrate can be partially etched at a temperature of about 500 to about 700° C. In one embodiment, the method further comprises, prior to partially etching the semiconductor substrate, implanting halo dopants into the semiconductor substrate to form a preliminary halo implant region, and partially removing the preliminary halo implantation region while partially etching the semiconductor substrate to form a halo implantation region making contact with the third surface of the semiconductor substrate, the halo implantation region preventing the impurities from diffusing into the semiconductor substrate. In one embodiment, the halo dopants comprise conductivity types substantially different from those of the impurity regions.

In one embodiment, the epitaxial layer comprises silicon-germanium.

In one embodiment, the epitaxial layer comprises a first crystalline structure growing from the third surface of the {111} crystal plane in the [111] direction, and a second crystalline structure growing from the second surface of the {100} crystal plane in the [100] direction.

In one embodiment, the epitaxial layer comprises a surface higher than the first surface of the semiconductor substrate.

In one embodiment, implanting the impurities and growing the epitaxial layer are simultaneously performed.

In one embodiment, the impurities comprise carbon, boron or phosphorous.

According to one embodiment of the present invention, before etching the semiconductor substrate to form the second surface and the third surface, halo dopants are implanted into the semiconductor substrate to form a preliminary halo implantation region. The preliminary halo implantation region is partially removed during the etching process to form a halo implantation region making contact with the side face, thereby preventing the impurities from diffusing into the semiconductor substrate.

According to another embodiment of the present invention, the impurities are implanted into the semiconductor substrate while the epitaxial layer grows.

In accordance with still another aspect of the present invention, there is provided a method of manufacturing a transistor. In the method of manufacturing the transistor, a gate pattern is formed on a surface of the {100} crystal plane of a semiconductor substrate. A first spacer is formed on a sidewall of the gate pattern. A second spacer is formed on the first spacer. Portions of the semiconductor substrate adjacent to both sides of the gate pattern are partially etched to form a recess exposing a portion of the gate pattern and the first and second spacers. The recess has a bottom face of the {100} crystal plane having a height lower than that of the surface, and a side face of the {111} crystal plane connecting the surface to bottom face. An epitaxial layer grows to fill up the recess. Impurities are then implanted into the epitaxial layer to form impurity regions.

In one embodiment, the side face is positioned beneath the first and second spacers.

In one embodiment, the method further comprises, prior to forming the second spacer, implanting halo dopants into the semiconductor substrate using the first spacer as an ion implantation mask to form a preliminary halo implantation region, and partially removing the preliminary halo implantation region while forming the recess to form a halo implantation region making contact with the side face, the halo implantation region preventing the impurities from diffusing into the semiconductor substrate.

In one embodiment, etching the portions of the semiconductor substrate is carried out using an etching gas that includes HCl and at least one of $GeH_4$, $SiH_4$ and $SiH_2Cl_2$.

In one embodiment, etching the portions of the semiconductor substrate is performed at a temperature of about 500 to about 700° C.

In one embodiment, the epitaxial layer comprises a surface higher than the surface of the semiconductor substrate.

In one embodiment, the epitaxial layer comprises silicon-germanium.

In one embodiment, implanting the impurities and growing the epitaxial layer are simultaneously performed.

In accordance with still another aspect of the present invention, there is provided a method of manufacturing a transistor. In the method of manufacturing the transistor, a gate pattern is formed on a surface of the {100} crystal plane of a semiconductor substrate. First spacers are formed on sidewalls of the gate pattern. Portions of the semiconductor substrate adjacent to both sides of the gate pattern are partially etched to form recesses exposing a portion of the gate pattern and the first spacer. The recesses have bottom faces of the {100} crystal plane having heights lower than that of the surface, and side faces of the {111} crystal plane connecting the surface to bottom faces. Epitaxial layers grow to fill up the recesses. Second spacers are formed on the first spacers and the epitaxial layers. Impurities are then implanted into the epitaxial layers to form impurity regions.

In one embodiment, the method further comprises, prior to etching the portions of the semiconductor substrate, implanting halo dopants into the semiconductor substrate using the first spacers as ion implantation masks to form preliminary halo implantation regions, and partially removing the preliminary halo implantation regions while forming the recesses to form halo implantation regions making contact with the side faces of the recesses, the halo implantation regions preventing the impurities from diffusing into the semiconductor substrate. In one embodiment, the epitaxial layers comprise surfaces higher than the surface of the semiconductor substrate.

In accordance with still another aspect of the present invention, there is provided a transistor including a semiconductor substrate that has a first surface of a {100} crystal plane, a second surface of the {100} crystal plane having a height lower than that of the first surface, and a third surface of a {111} crystal plane connecting the first surface to the second surface. First heavily doped impurity regions are formed under the second surface. A gate structure is formed on the first surface. An epitaxial layer is formed on the second surface and the third surface. Second heavily doped impurity regions are formed at both sides of the gate structure.

In accordance with still another aspect of the present invention, there is provided a transistor including a semiconductor substrate that has a first surface of a {100} crystal plane, a second surface of the {100} crystal plane having a height lower than that of the first surface, and a third surface of a {111} crystal plane connecting the first surface to the second surface. A gate structure is formed on the first surface. The gate structure includes a gate insulation layer formed on the first surface, a conductive layer pattern formed on the gate insulation layer, and an epitaxial gate layer formed on the conductive layer pattern. An epitaxial layer is formed on the second surface and the third surface. Impurity regions are formed at both sides of the gate structure.

In accordance with still another aspect of the present invention, there is provided a method of manufacturing a transistor. In the method of manufacturing the transistor, there is provided a semiconductor substrate including a first surface of a {100} crystal plane, a second surface of the {100} crystal plane having a height lower than that of the first surface, and a third surface of a {111} crystal plane connecting the first surface to the second surface. A gate structure is formed on the first surface. First impurities are implanted into the second surface using the gate as an implantation mask to form first heavily doped impurity regions. An epitaxial layer is grown on the second surface and the third surface. Second impurities are implanted into the epitaxial layer to form second heavily doped impurity regions.

In accordance with still another aspect of the present invention, there is provided a method of manufacturing a transistor. In the method of manufacturing the transistor, there is provided a semiconductor substrate including a first surface of a {100} crystal plane, a second surface of the {100} crystal plane having a height lower than that of the first surface, and a third surface of a {111} crystal plane connecting the first surface to the second surface. A gate pattern is formed on the first surface. The gate pattern includes a gate insulation layer, a conductive layer pattern and an epitaxial gate layer sequentially stacked. An epitaxial layer is grown on the second surface and the third surface. Impurities are implanted into the epitaxial layer to form heavily doped impurity regions.

In accordance with still another aspect of the present invention, there is provided a method of manufacturing a transistor. In the method of manufacturing the transistor, a gate insulation layer and a conductive layer pattern are sequentially formed on a surface of the {100} crystal plane of a semiconductor substrate. First spacers are formed on sidewalls of the conductive layer pattern. Second spacers are formed on the first spacers. Portions of the semiconductor substrate adjacent to both sides of the conductive layer pattern are partially etched to form recesses exposing a portion of the conductive layer pattern and the first and second spacers. The recesses have bottom faces of the {100} crystal plane having heights lower than that of the surface, and side faces of the {111} crystal plane connecting the surface to bottom faces. First impurities are implanted into the bottom faces of the recesses to form first heavily doped impurity regions. Epitaxial layers are grown to fill up the recesses. Simultaneously, epitaxial gate layers are grown from a surface of the conductive layer pattern. Second impurities are then implanted into the epitaxial layers to form second heavily doped impurity regions.

In accordance with still another aspect of the present invention, there is provided a method of manufacturing a transistor. In the method of manufacturing the transistor, a gate insulation layer and a conductive layer pattern are sequentially formed on a surface of the {100} crystal plane of a semiconductor substrate. First spacers are formed on sidewalls of the conductive layer pattern. Portions of the semiconductor substrate adjacent to both sides of the conductive layer pattern are partially etched to form recesses exposing a portion of the conductive layer pattern and the first and second spacers. The recesses have bottom faces of the {100} crystal plane having heights lower than that of the surface, and side faces of the {111} crystal plane connecting the surface to bottom faces. First impurities are implanted into the bottom faces of the recesses to form first heavily doped impurity regions. Epitaxial layers are grown to fill up the recesses. Simultaneously, epitaxial gate layers are grown from a surface of the conductive layer pattern. Second spacers are formed on the first spacers and the epitaxial layers. Second impurities are then implanted into the epitaxial layers to form second heavily doped impurity regions.

According to the present invention, since the impurity regions have side faces of the {111} crystal plane, a PN junction may be steeply formed. Thus, generating a short channel effect between the impurity regions may be prevented so that a transistor having improved electrical characteristics is obtained.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thicknesses of layers are exaggerated for clarity.

DESCRIPTION OF THE EMBODIMENTS

Figure 1:
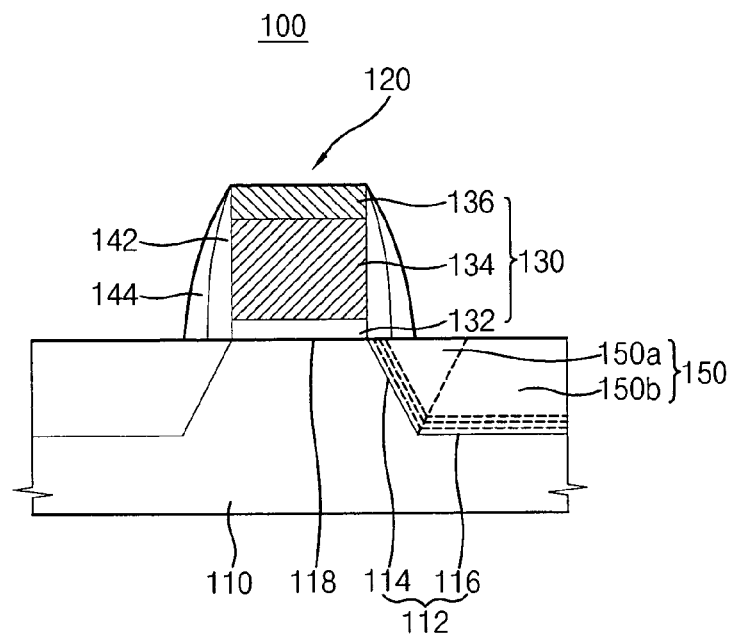
FIG. 1 is a cross sectional view illustrating a transistor in accordance with a first embodiment of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment 1

FIG. 1 is a cross sectional view illustrating a transistor in accordance with a first embodiment of the present invention.

Referring to FIG. 1, a transistor 100 of the present embodiment includes a semiconductor substrate 110 such as a silicon (Si) substrate or a silicon-germanium (Si—Ge) substrate, a gate structure 120 formed on the semiconductor substrate 110, two epitaxial layers 150 formed at portions of the semiconductor substrate 110 adjacent to the gate structure 120, and impurity regions respectively formed in the epitaxial layers 150.

The semiconductor substrate 110 has a first surface 118 including silicon oriented along a {100} crystal plane, a second surface 116 oriented along a {100} crystal plane, and a third surface 114 oriented along a {111} crystal plane. The gate structure 120 is formed on the first surface 118 of the substrate 110.

Two recesses 112 are respectively formed at portions of the first surface 118 adjacent to the gate structure 120 to form the second surface 116 and the third surface 114. The recesses 112 include bottom faces 116 and side faces 114, respectively. The bottom faces 116 include silicon oriented along a {100} crystal plane, whereas the side faces 114 include silicon oriented along a {111} crystal plane. That is, the bottom faces 116 of the recesses 112 correspond to the second surface of the semiconductor substrate 110 and the side faces 114 correspond to the third surface of the semiconductor substrate 110. Each of the bottom faces 116 has a height substantially less than that of the surface 118 of the substrate 110. Each of the side faces 114 is between the bottom face 116 and the surface 118 to connect the bottom face 116 to the surface 118. Since the side face 114 is positioned along the {111} crystal plane, an angle between the side face 114 and the bottom face 116 is about 54.7°. For example, the angle may be no less than about 50° or about 54.7° in processes for forming the transistor 100. When the angle between the side face 114 and the bottom face 116 is preferably in a range of about 50 to about 65°, preferably about 54.7 to about 65°, the side face 114 may be regarded as including silicon substantially oriented along the {111} crystal plane.

The gate structure 120 includes a gate pattern 130 formed on the surface 118 of the substrate 110, and spacing members formed on sidewalls of the gate pattern 130.

The gate pattern 130 includes a gate insulation layer pattern 132 formed on the surface 118 of the substrate 110, a conductive layer pattern 134 formed on the gate insulation layer pattern 132, and a hard mask layer pattern 136 formed on the conductive layer pattern 134.

A portion of the surface 118 of the substrate 110 beneath the gate insulation layer pattern 132 serves as a channel layer that selectively and electrically connects one impurity region to another impurity region.

The gate insulation layer pattern 132 may include silicon oxide, silicon oxynitride, metal oxide, metal oxynitride, etc. The conductive layer pattern 134 may include a metal such as tungsten (W), copper (Co), aluminum (Al), metal nitride, etc. In addition, the hard mask layer pattern 136 may include silicon nitride.

Each of the spacing members may have a double spacer structure. That is, each of the spacing members includes first spacers 142 and second spacers 144. The first spacers 142 are formed on the sidewalls of the gate pattern 130 and the second spacers 144 are positioned on the first spacers 142. Since the spacing members assure a sufficient channel length of the transistor 100, a short channel effect generated in the transistor 100 may be prevented. Particularly, the side faces 114 of the recesses 112 are between the gate pattern 130 and the second spacers 144. The first and second spacers 142 and 144 may include a substantially identical material, for example, silicon nitride. Alternatively, the first and second spacers 142 and 144 may include different materials from each other. For example, the first spacers 142 may include an oxide, whereas the second spacers 144 may include a nitride. Furthermore, each of the spacing members may have a single spacer structure.

The epitaxial layers 150 are formed in the recesses 112, respectively. The epitaxial layers 150 may include silicon germanium. Silicon germanium films grow from the side faces 114 and the bottom faces 116 of the recesses 112 to thereby form the epitaxial layers 150 filling up the recesses 112. As a result, each epitaxial layer 150 has a side face of the {111} crystal plane and a bottom face of the {100} crystal plane so that the epitaxial layer 150 may have a heterogeneous structure.

Impurities are implanted into the epitaxial layers 150 to form the impurity regions in the epitaxial layers 150. The impurities may include carbon (C), boron (B), phosphorous (P), etc. According to the present embodiment, each of the impurity regions has an area substantially identical to that of the epitaxial layer 150. Thus, each impurity region may have a side face substantially corresponding to that of the epitaxial layer 150.

Hereinafter, a method of manufacturing the transistor in FIG. 1 will be described in detail with reference to the accompanying drawings.

FIGS. 2 to 5 are cross sectional views illustrating the method of manufacturing the transistor in FIG. 1.

Figure 2:
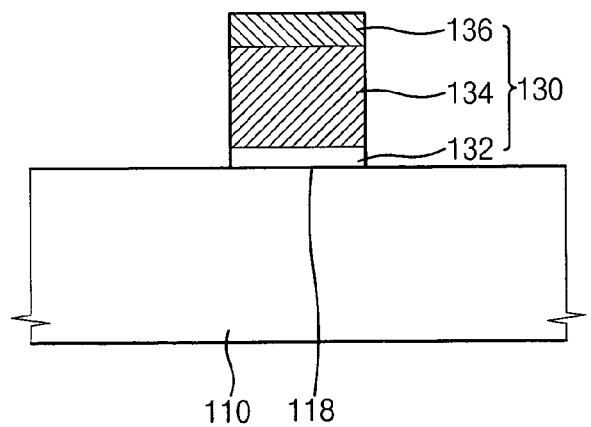
FIGS. 2 to 5 are cross sectional views illustrating a method of forming the transistor in FIG. 1.

Referring to FIG. 2, the gate pattern 130 is formed on the surface 118 of the {100} crystal plane. The substrate 110 may correspond to the silicon substrate or the silicon-germanium substrate. In particular, an insulation layer (not shown) is formed on the surface 118 of the substrate 110. The insulation layer may include an oxide. A conductive layer (not shown) is formed on the insulation layer. The conductive layer may include a metal such as tungsten. A hard mask layer (not shown) is formed on the conductive layer. The hard mask layer may include a nitride such as silicon nitride. A photoresist pattern (not shown) is formed on the hard mask layer. The hard mask layer, the conductive layer and the insulation layer are partially etched using the photoresist pattern as an etching mask to thereby form the gate pattern 130 on the surface 118 of the substrate 110. The gate pattern 130 includes the insulation layer pattern 132, the conductive layer pattern 134 and the hard mask layer pattern 136. Then, the photoresist pattern on the gate pattern is removed by an ashing process and/or a stripping process.

Figure 3:
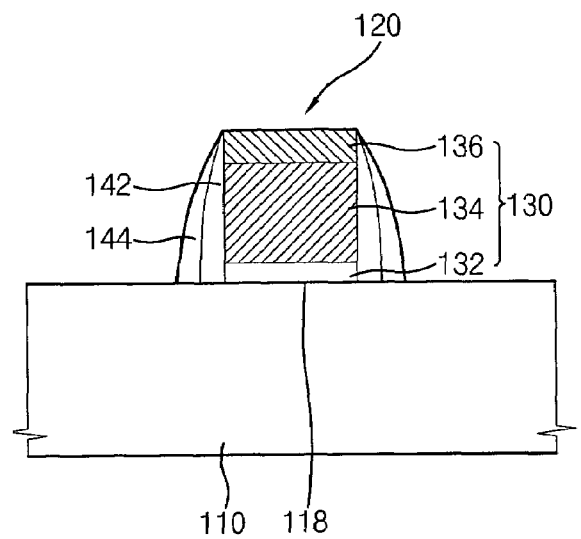

Referring to FIG. 3, a first nitride layer (not shown) is formed on the substrate 110 to cover the gate pattern 130. The first nitride layer is partially etched to form the first spacers 142 on the sidewalls of the gate pattern 130. For example, the first nitride layer includes silicon nitride.

A second nitride layer (not shown) is then formed on the substrate 110 to cover the gate pattern 130 and the first spacers 142. For example, the second nitride layer includes silicon nitride. The second nitride layer is partially etched to form the second spacers 144 on the first spacers 142, respectively. Thus, the spacing members including the first and second spacers 142 and 144 are formed on the sidewalls of the gate pattern 130. As a result, the gate structure 120 including the gate pattern 130 and the spacing members is formed on the substrate 110.

Figure 4:
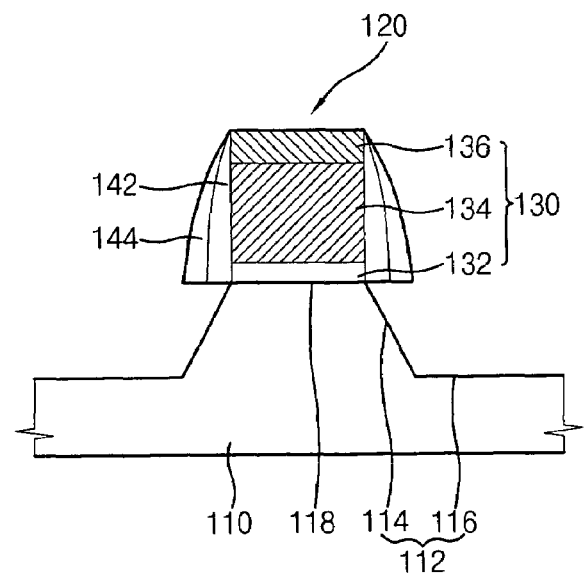

Referring to FIG. 4, the portions of the substrate 110 adjacent to the both sides of the gate structure 120 are partially etched to form the recesses 112 that have the side faces 114 of the {111} crystal plane and the bottom faces 116 of the {100} crystal plane. The portions of the substrate 110 may be etched by a dry etching process using an etching gas that includes hydrogen chloride (HCl). When the recesses 112 are formed, bottom faces of the first and second spacers 142 and 144 are exposed through the recesses 112.

In general, a method of etching a silicon-based material in a deposition chamber using an HCl gas has been widely used. In the present embodiment, the HCl gas etches not the silicon-based material but the portions of the substrate 110 including silicon in a deposition chamber. Therefore, the etching process of the present embodiment may not demand any additional etching chamber except for the deposition chamber. In addition, the HCl gas may be massively produced and widely used so that the etching process for partially etching the substrate 110 may be carried out stably and simply. Furthermore, since successive etching processes and deposition processes may be performed in-situ, an intermediate process such as a cleaning process may be omitted, thereby greatly reducing the time required for manufacturing the transistor 120.

In the present embodiment, the portions of the substrate 110 may be etched at a temperature of about 850° C. under a partial pressure of the HCl gas of about 10 Torr. In addition, the etching gas may further include an additional gas containing hydrogen such as $GeH_4$, $SiH_4$, $SiH_2Cl_2$ (dichlorosilane: DCS), etc. When the etching gas includes the additional gas containing hydrogen, the additional gas containing hydrogen serves as a catalyst relative to the HCl gas, based on a thermal equilibrium between the gases. Hence, the HCl gas may rapidly etch silicon at the portions of the substrate 110 due to the thermal equilibrium between the etching reaction gases. When the etching gas includes the HCl gas and the additional gas containing hydrogen by a predetermined volume ratio, the etching gas may etch silicon by an etching rate of about 1 nm/second at a temperature of about 730° C. Thus, each of the recesses 112 may have a depth of above about 50 nm when the etching process is performed for about one minute.

The etching process of etching the portions of the substrate 110 may be carried out at a temperature of about 500 to about 850° C., preferably a temperature of about 500 to about 700° C. using an etching gas including the HCl gas and the gas containing hydrogen such as $GeH_4$, $SiH_4$, $SiH_2Cl_2$ gas, etc.

Figure 5:
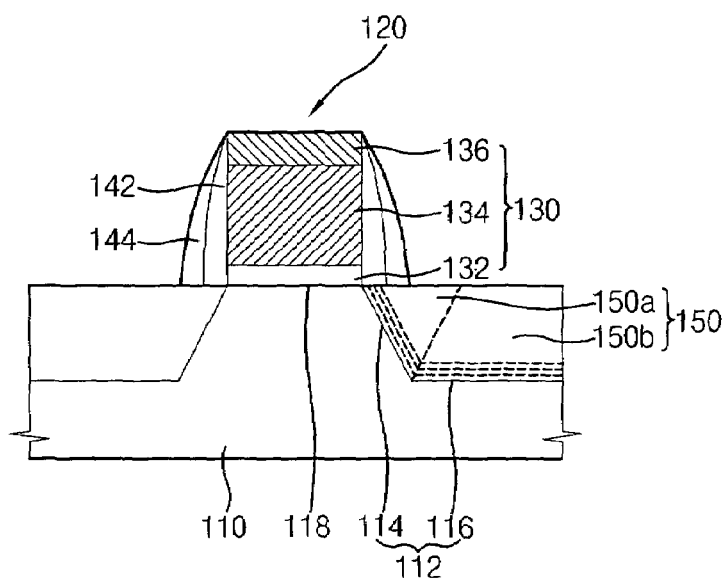

Referring to FIG. 5, a source gas containing silicon-germanium, for example, $GeH_4$, $SiH_4$ or $SiH_2Cl_2$ is introduced onto the recesses 112. Silicon-germanium in the source gas epitaxially grows from the side faces 114 and the bottom faces 116 of the recesses 112 to thereby form the epitaxial layers 150 respectively filling up the recesses 112 as shown phantom lines in FIG. 5. For example, the epitaxial layers 150 are formed to fill up the recesses 112 by a chemical vapor deposition (CVD) process. Here, since each recess 112 has the side face 114 of the {111} crystal plane and the bottom face 116 of the {100} crystal plane, each of the epitaxial layers 150 has a hetero crystalline structure in which a first crystalline structure 150a grows from the side face 114 along the [111] direction, and a second crystalline structure 150b grows from the bottom face 116 in the [100] direction.

Alternatively, the source gas containing silicon-germanium and the impurities including carbon, boron or phosphorous may be simultaneously introduced onto the recesses 112 to thereby form the epitaxial layers 150 doped with the impurities.

As a result, the transistor 120 that includes the impurity regions each of which has the area substantially identical to that of the epitaxial layer 150 is formed on the substrate 110. That is, each impurity region may have a side boundary substantially corresponding to the side face of the epitaxial layer 150.

Embodiment 2

Figure 7:
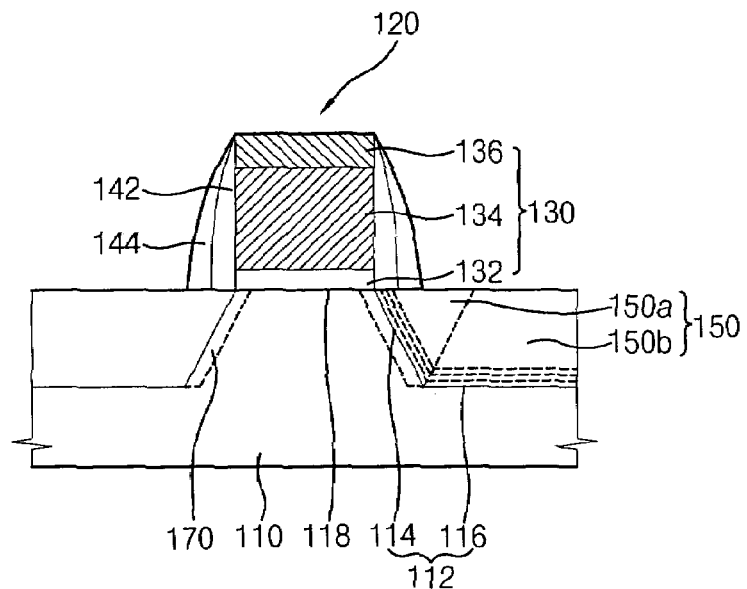

A transistor of a second embodiment of the present invention has elements substantially identical to those of the transistor in FIG. 1 except impurity regions 170 having side faces substantially different from those of epitaxial layers 150 as shown in FIG. 7. The side faces of the impurity regions 170 are respectively positioned between a central portion of a gate pattern 130 and side faces of the epitaxial layers 150. Thus, any further detailed description concerning the transistor of the present embodiment will not be repeated.

Figure 6:
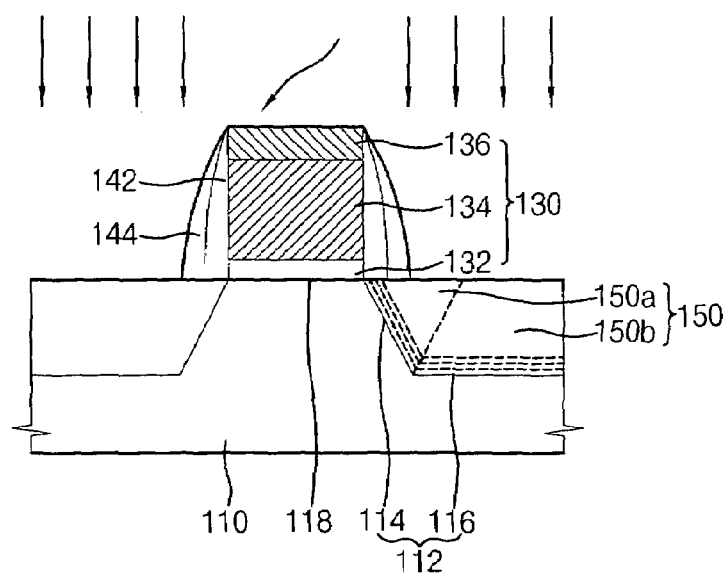
FIGS. 6 and 7 are cross sectional views illustrating a method of forming a transistor in accordance with a second embodiment of the present invention.

FIGS. 6 and 7 are cross sectional views illustrating a method for manufacturing the transistor in accordance with the present embodiment. In the present embodiment, processes for manufacturing the transistor are substantially identical to those described with reference to FIGS. 2 to 5 except for a process for forming the impurity regions 170.

Referring to FIG. 6, impurities including carbon, boron, phosphorous, etc, are implanted into the epitaxial layers 150 by an ion implantation process as shown by the arrows in the figure. In Embodiment 1, the source gas and the impurities are simultaneously provided in recesses 112 to form the epitaxial layers 150 doped with the impurities in Embodiment 1. However, according to the present embodiment, after undoped epitaxial layers 150 grow to fill up the recesses 112, the impurities are additionally implanted into the undoped epitaxial layers 150.

Referring to FIG. 7, the substrate 110 having the epitaxial layers 150 is thermally treated so that the impurities in the epitaxial layers 150 are diffused to form the impurity regions 170. The impurity regions 170 correspond to source/drain regions of the transistor. The source/drain regions are adjacent to both sides of a gate structure 120. Thus, the transistor including the gate structure 120 and the impurity regions 170 is formed on the substrate 110.

As described above, the impurity regions 170 have the side faces substantially different from those of the epitaxial layers 150. Each of the side faces of the impurity regions 170 is positioned between the central portion of the gate pattern 130 and the side face of the epitaxial layer 150. The impurity regions 170 having such side faces are formed by diffusing the impurities into the substrate 110 through a heat treatment process for annealing the substrate 110. Alternatively, the impurity regions 170 may have side faces substantially identical to those of the epitaxial layers 150 as described above.

Embodiment 3

A transistor of a third embodiment of the present invention has a structure substantially identical to that of the transistor in FIG. 1. Thus, a method of manufacturing the transistor of the present embodiment will be described with reference to FIGS. 8 to 12.

FIGS. 8 to 12 are cross sectional views illustrating the method of manufacturing the transistor according to the third embodiment of the present invention. In the present embodiment, after first spacers 142 are formed on sidewalls of a gate pattern 130, epitaxial layers 150 are formed in recesses 112 before second spacers 144 are formed on the first spacers 142.

Figure 8:
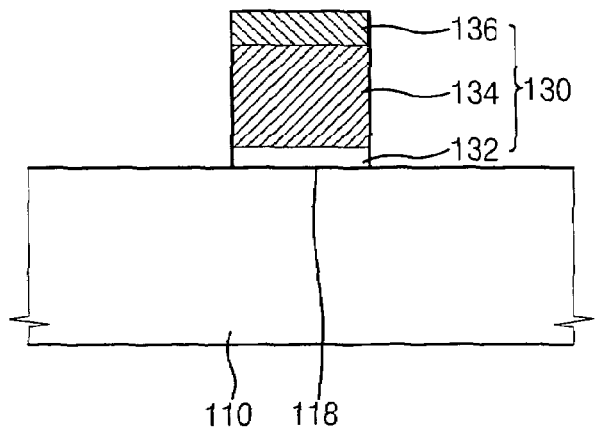
FIGS. 8 to 12 are cross sectional views illustrating a method of forming a transistor in accordance with a third embodiment of the present invention.

Referring to FIG. 8, the gate pattern 130 including an insulation layer pattern 132, a conductive layer pattern 134 and a hard mask layer pattern 136 are formed on a surface 118 of a semiconductor substrate 110. The surface 118 includes silicon oriented along the {100} crystal plane.

Figure 9:
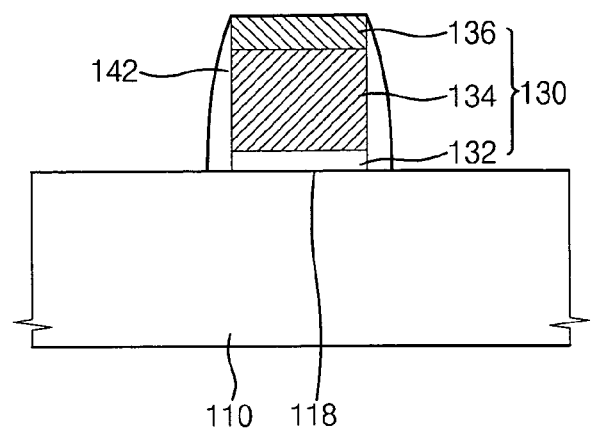

Referring to FIG. 9, the first spacers 142 including a nitride are formed on the sidewalls of the gate pattern 130, respectively. For example, the first spacers 142 include silicon nitride.

Figure 10:
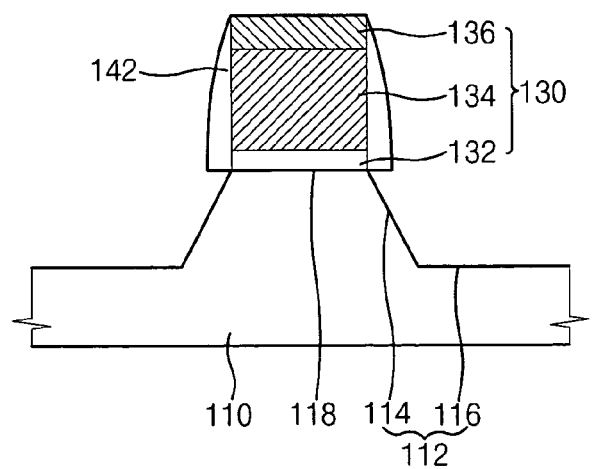

Referring to FIG. 10, portions of the surface 118 adjacent to both sides of the gate pattern 130 are etched to thereby form the recesses 112 at the portions of the surface 118. The recesses 112 may be formed by a dry etching process using an etching gas. The etching gas may include HCl and one of $GeH_4$, $SiH_4$ and $SiH_2Cl_2$. The dry etching process for forming the recesses 112 may be carried out under etching conditions substantially identical to those described in Embodiment 1. The recesses 112 have side faces 114 of the {111} crystal plane and bottom faces 116 of the {100} crystal plane. When the recesses 112 are formed by partially etching the substrate 110, bottom faces of the first spacers 142 are exposed through the recesses 112.

Figure 11:
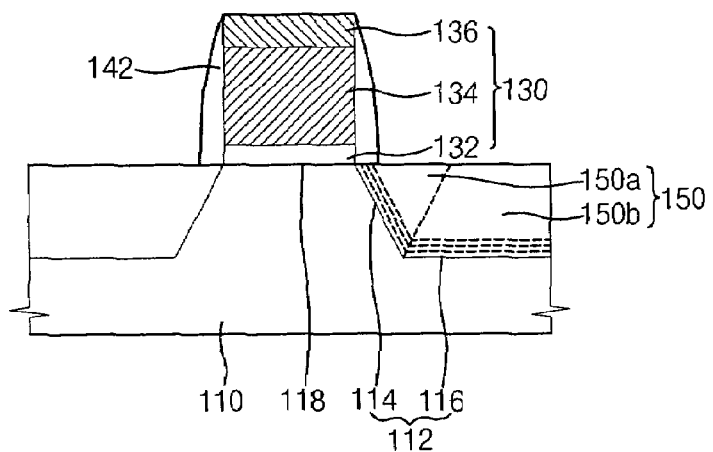

Referring to FIG. 11, a source gas containing silicon-germanium is introduced onto the recesses 112. Silicon-germanium epitaxially grows from the side faces 114 and the bottom faces 116 of the recesses 112 to thereby form the epitaxial layers 150 in the recesses 112, respectively. Since each recess 112 has the side face 114 of the {111} crystal plane and the bottom face 116 of the {100} crystal plane, each of the epitaxial layers 150 has a hetero structure in which a first crystalline structure 150a grows from the side face 114 in the [111] direction, and a second crystalline structure 150b grows from the bottom face 116 in the [100] direction. Alternatively, the source gas containing silicon-germanium and impurities including carbon, boron or phosphorous may be simultaneously introduced onto the recesses 112 to form the epitaxial layers 150 doped with the impurities.

Figure 12:
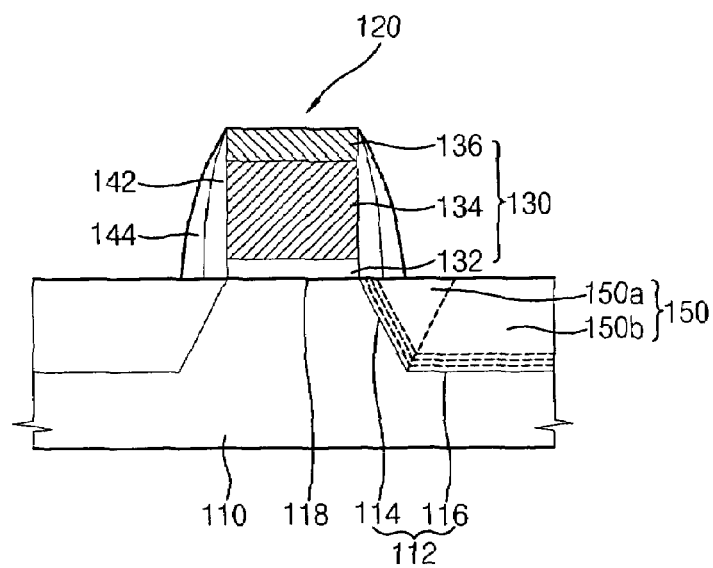

Referring to FIG. 12, the second spacers 144 including nitride are respectively formed on the first spacers to form spacing members on the sidewalls of the gate pattern 130. The spacing members include the first spacers 142 and the second spacers 144. Thus, a gate structure 120 including the gate pattern 130 and the spacing members are formed on the substrate 110. For example, the second spacers 144 include silicon nitride. Bottom portions of the second spacers 144 are respectively positioned on the epitaxial layers 150. Therefore, impurity regions of the transistor have boundaries substantially identical to those of the epitaxial layers 150. Particularly, each of the impurity regions has a side face substantially corresponding to that of the epitaxial layer 150.

Alternatively, the impurities including carbon, boron or phosphorous may be implanted into the epitaxial layers 150 to form the impurity regions having the side faces different from those of the epitaxial layers 150. Each side face of the impurity region is positioned between a central portion of the gate pattern 130 and the side face of the epitaxial layer 150.

Embodiment 4

Figure 13:
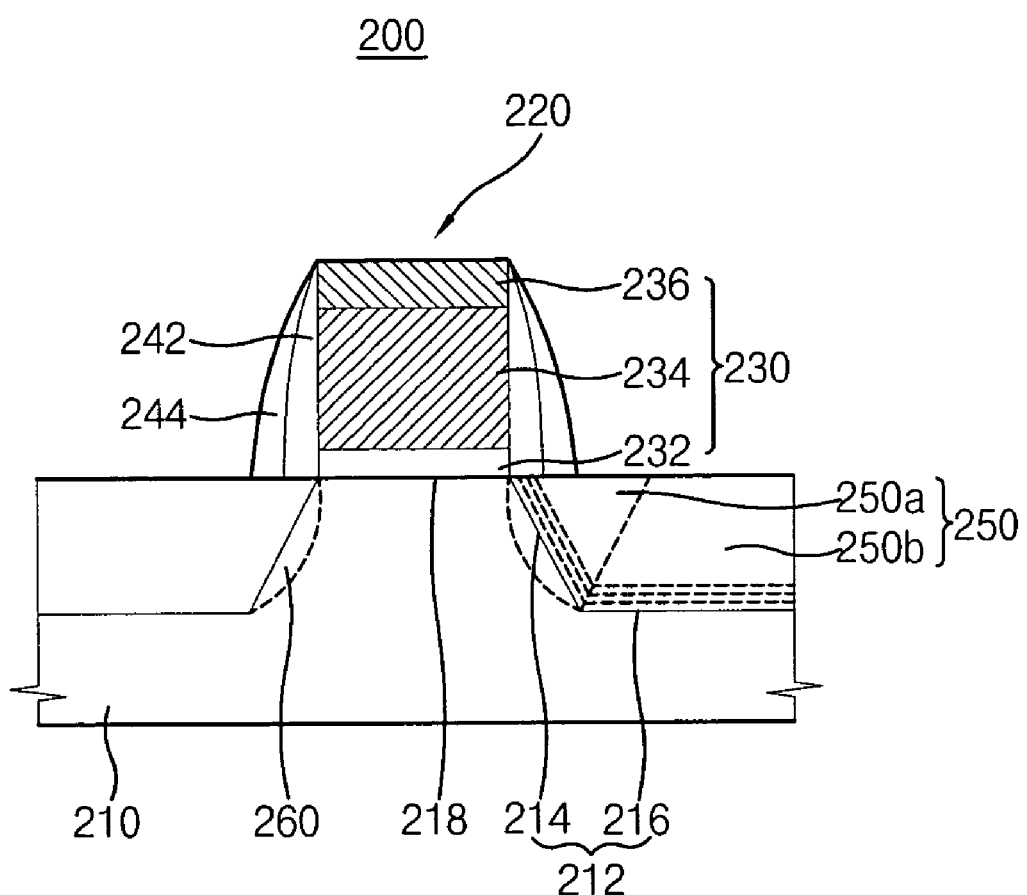
FIG. 13 is a cross sectional view illustrating a transistor in accordance with a fourth embodiment of the present invention.

FIG. 13 is a cross sectional view illustrating a transistor in accordance with a fourth embodiment of the present invention.

Referring to FIG. 13, a transistor 200 of a fourth embodiment of the present invention includes a semiconductor substrate 210, a gate structure 220 formed on the semiconductor substrate 210, two epitaxial layers 250 formed adjacent to both sides of the gate structure 220, impurity regions formed in the epitaxial layers 250, and halo implantation regions 260.

The semiconductor substrate 210 has a surface 218 of the {100} crystal plane. Two recesses 212 are formed at portions of the surface 218 adjacent to sidewalls of the gate structure 220. Each of the recesses 212 includes a bottom face 216 of the {100} crystal plane and side face 214 of the {111} crystal plane. The bottom face 216 has a height substantially less than that of the surface 218. The side face 214 connects the bottom face 216 to the surface 218.

The gate structure 220 includes a gate pattern 230 formed on the surface 218, and spacing members formed on sidewalls of the gate pattern 230. The gate pattern 230 includes a gate insulation layer pattern 232 formed on the surface 218, a conductive layer pattern 234 formed on the gate insulation layer pattern 232, and a hard mask layer pattern 236 formed on the conductive layer pattern 234. The spacing members may have dual spacer structures that include first spacers 242 formed on the sidewalls of the gate pattern 230, and second spacers 244 formed on the first spacers 242. Each side face 214 of the recess 212 is positioned between a central portion of the gate pattern 230 and the second spacer 244.

The epitaxial layers 250 including silicon-germanium are formed in the recesses 212. The epitaxial layers 250 have side faces of the {111} crystal plane and bottom faces of the {100} crystal plane, respectively.

Impurities are implanted into the epitaxial layers 250 to form the impurity regions in the epitaxial layers 250. The impurity regions of the present embodiment have side faces substantially corresponding to those of the epitaxial layers 150.

The halo implantation regions 260 are formed in portions of the semiconductor substrate 210 adjacent to the side faces 214 of the recesses 212. Thus, the halo implantation regions 260 partially make contact with the side faces of the epitaxial layers 250. The halo implantation regions 260 have conductivity types substantially different from those of the impurity regions to thereby prevent impurities in the impurity regions from diffusing into the semiconductor substrate 210.

Hereinafter, a method of forming the transistor in FIG. 13 will be described in detail with reference to FIGS. 14 to 19.

FIGS. 14 to 19 are cross sectional views illustrating the method of manufacturing the transistor in accordance with the present embodiment.

Figure 14:
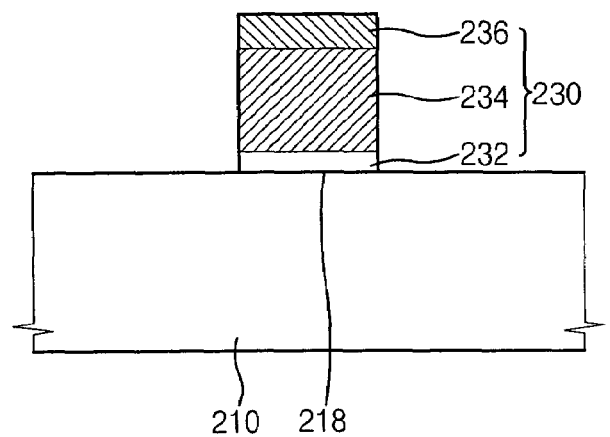
FIGS. 14 to 18 are cross sectional views illustrating a method of forming the transistor in FIG. 13.

Referring to FIG. 14, the gate pattern 230 including the gate insulation layer pattern 232, the conductive layer pattern 234 and the hard mask layer pattern 236 is formed on the surface 218 including silicon arranged along the {100} crystal plane as described above.

Figure 15:
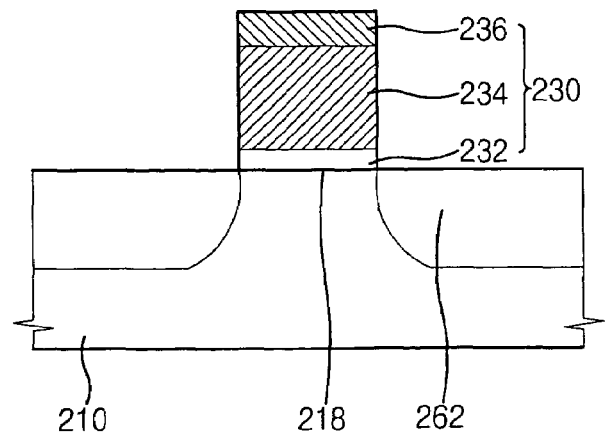

Referring to FIG. 15, halo dopants are implanted into the portions of the semiconductor substrate 210 adjacent to both sides of the gate pattern 230 so that preliminary halo implantation regions 262 are formed at the portions of the substrate 210. The preliminary halo implantation regions 262 have conductivity types substantially corresponding to that of the semiconductor substrate 210. Before forming the preliminary halo implantation regions 262, impurities may be implanted into the portions of the semiconductor substrate 210 with a relatively low concentration to thereby form lightly doped drain (LDD) regions (not shown) at the portions of the substrate 210.

Figure 16:
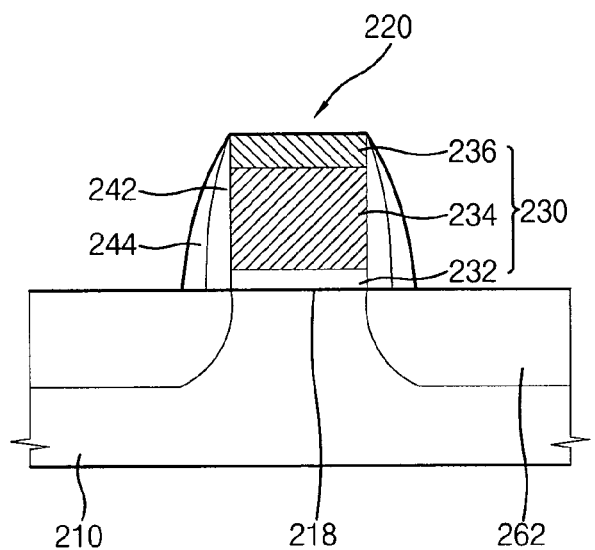

Referring to FIG. 16, the first spacers 242 are formed on the sidewalls of the gate pattern 230. Then, the second spacers 244 are formed on the first spacers 242 to form the spacing members on the sidewalls of the gate pattern 230. The first and second spacers 242 and 244 may include a nitride such as silicon nitride. Hence, the gate structure 220 including the gate pattern 230 and the first and second spacers 242 and 244 is formed on the substrate 210.

Figure 17:
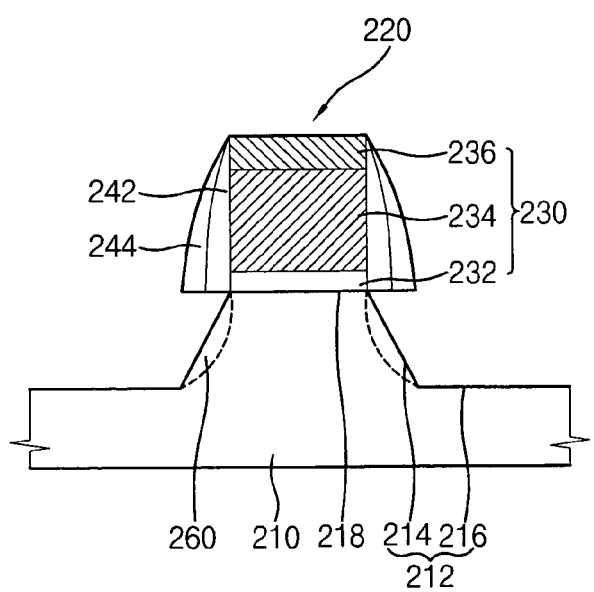

Referring to FIG. 17, the preliminary halo implantation regions 262 are partially etched to form the recesses 212 having the side faces 214 of the {111} crystal plane and the bottom faces 216 of the {100} crystal plane. Here, the halo implantation regions 260 are formed adjacent to the side faces 214 of the recesses 212. That is, remaining preliminary halo implantation regions 262 respectively correspond to the halo implantation regions 260. When the recesses 212 are formed, bottom faces of the first and second spacers 242 and 244 are exposed through the recesses 212. The halo implantation regions 260 make contact with the side faces 214 of the recesses 212. The preliminary halo implantation regions 262 may be etched using an etching gas that includes HCl and at least one of $GeH_4$, $SiH_4$ and $SiH_2Cl_2$. The etching process of etching the preliminary halo implantation regions 262 is performed under an etching condition substantially identical to that of the etching process according to Embodiment 1.

In the present embodiment, a chemical reaction between silicon and HCl in the preliminary halo implantation regions 262 may more actively occur in comparison with other portions of the semiconductor substrate 210 in which the halo dopants do not exist. The preliminary halo implantation regions 262 may be rapidly etched in a vertical direction relative to the substrate 210 so that a time of forming the recesses 212 in the preliminary halo implantation regions 262 may be shortened along the vertical direction. As a result, the side faces 214 of the {111} crystal plane may be readily formed beneath the spacing members.

Figure 18:
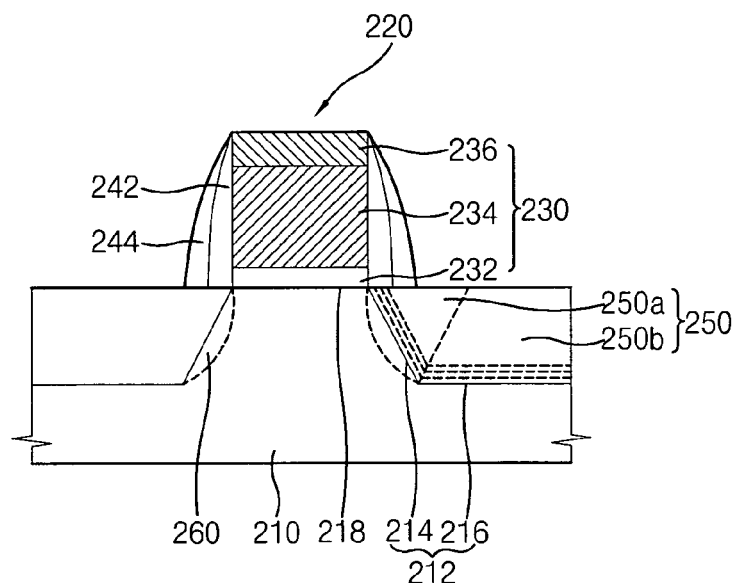

Referring to FIG. 18, a source gas including silicon-germanium is introduced onto the recess 212. Silicon-germanium epitaxially grows from the side faces 214 and the bottom faces 216 of the recesses 212 to respectively form the epitaxial layers 250 in the recesses 212. Since the recesses 212 have the side faces 214 of the {111} crystal plane and the bottom faces 216 of the {100} crystal plane, the epitaxial layers 250 have hetero structures in which first crystalline structures 250a grow from the side faces 214 in the [111] direction, and second crystalline structures 250b grow from the bottom faces 216 in the [100] direction. The source gas containing silicon-germanium and the impurities including carbon, boron or phosphorous may be simultaneously introduced onto the recesses 212 to thereby form the epitaxial layers 250 doped with the impurities.

As a result, impurity regions of the transistor 200 have boundaries substantially corresponding to the side faces of the epitaxial layers 150.

Each of the impurity regions has a conductivity type substantially different from that of the halo implantation region 260. For example, when the halo implantation regions 260 have P types, the impurity regions have N types and vice versa. Since the halo implantation regions 260 have conductivity types different from those of the impurity regions, the halo implantation regions 260 suppress the diffusion of the impurities into the semiconductor substrate 210. Thus, a short channel effect of the transistor 200 generated by adjacently disposing a source region and a drain region of the transistor 200 may be effectively prevented.

Embodiment 5

A transistor of a fifth embodiment of the present invention has elements substantially identical to those of the transistor in FIG. 13 except impurity regions 270 having side faces different from those of epitaxial layers 250. Each side face of the impurity region 270 is positioned between a central portion of a gate pattern 230 and side faces of the epitaxial layers 250. Thus, any further detailed description of the transistor of the present embodiment will not be repeated.

Figure 19:
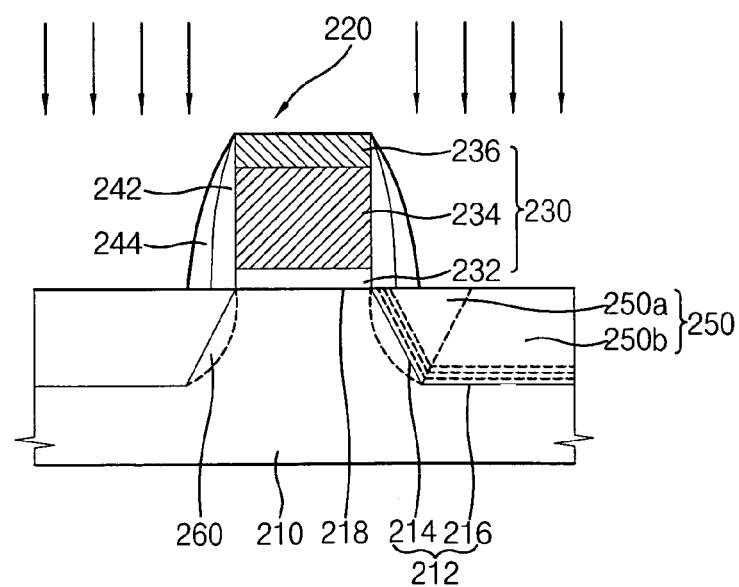
FIGS. 19 and 20 are cross sectional views illustrating a method of forming a transistor in accordance with a fifth embodiment of the present invention.
Figure 20:
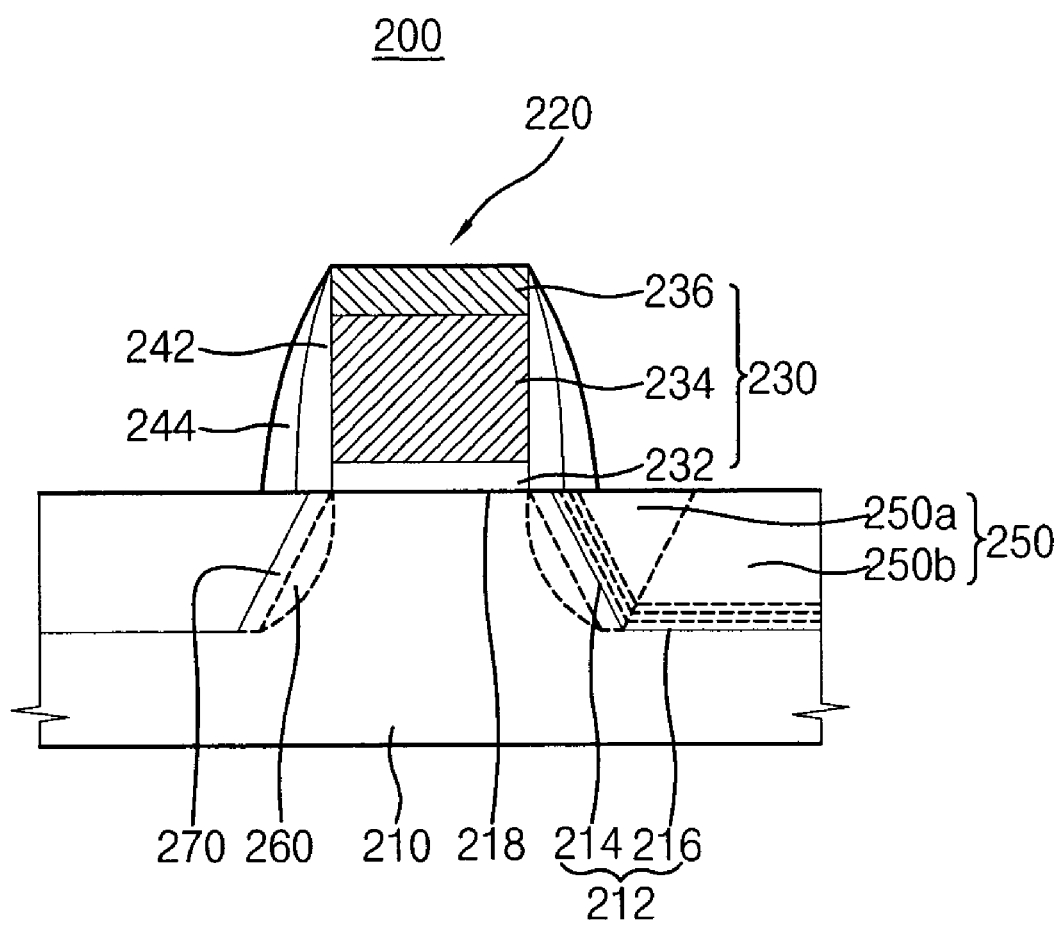

FIGS. 19 and 20 are cross sectional views illustrating a method of manufacturing the transistor according to the present embodiment. In the present embodiment, processes of forming the transistor are substantially identical to those of the fourth embodiment illustrated with reference to FIGS. 14 to 18 except for a process for forming impurity regions 270 (see FIG. 20). Therefore, processes after forming epitaxial layers 250 will be described in detail.

Referring to FIG. 19, impurities including carbon, boron or phosphorous are implanted into the epitaxial layers 250 by an ion implantation process. In Embodiment 4, the source gas and the impurities are simultaneously provided onto the recesses 212 to form the doped epitaxial layers 250. However, according to the present embodiment, after undoped epitaxial layers 250 grow to fill up the recesses 212, the impurities are implanted into the undoped epitaxial layers 250.

Referring to FIG. 20, a substrate 210 having the doped epitaxial layers 250 are thermally treated to form the impurity regions 270 in the epitaxial layers 250, respectively. The impurity regions 270 correspond to source/drain regions of the transistor. When the impurity regions 270 are formed adjacent to both sides of a gate structure 220, the transistor is completed on the substrate 210.

In the present embodiment, the impurity regions 270 have side faces different from those of the epitaxial layers 250 as described above. That is, each side face of the impurity region 270 is positioned between a central portion of a gate pattern 230 and the side face of the epitaxial layer 250. The impurity regions 270 having such side faces are formed by diffusing the impurities into the semiconductor substrate 210 through an annealing process for thermally treating the substrate 210. Alternatively, the impurity regions 270 may have side faces substantially corresponding to those of the epitaxial layers 250.

Embodiment 6

A transistor of a sixth embodiment of the present invention has a structure substantially identical to that of the transistor in FIG. 13. Thus, any further detailed description with regard to the structure of the transistor will not be repeated.

FIGS. 21 to 26 are cross sectional views illustrating a method of manufacturing the transistor in accordance with the present embodiment. In the present embodiment, after first spacers 242 are formed on sidewalls of a gate pattern 230, epitaxial layers 250 are formed before second spacers 244 are formed on the first spacers 242.

Figure 21:
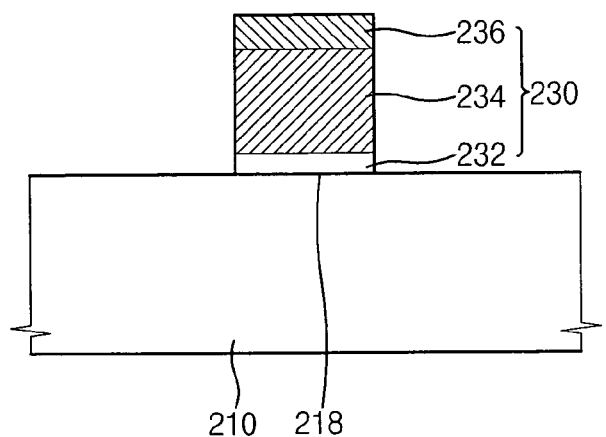
FIGS. 21 to 26 are cross sectional views illustrating a method of forming a transistor in accordance with a sixth embodiment of the present invention.

Referring to FIG. 21, the gate pattern 230 including a gate insulation layer pattern 232, a conductive layer pattern 234 and a hard mask layer pattern 236 is formed on a surface 218 of a semiconductor substrate 210. The surface 218 includes silicon oriented along the {100} crystal plane.

Figure 22:
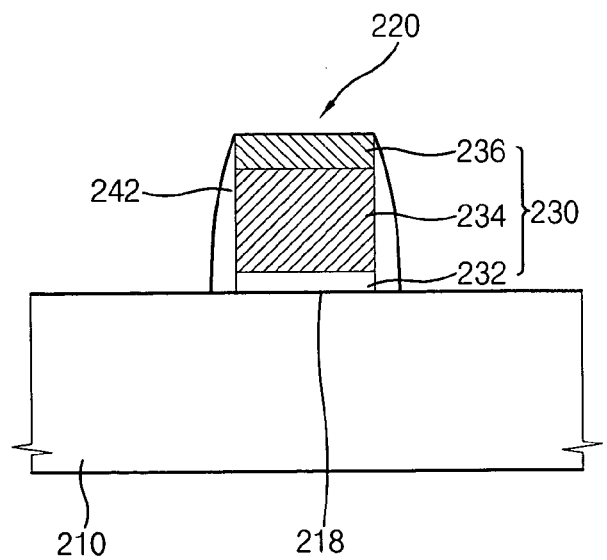

Referring to FIG. 22, the first spacers 242 are respectively formed on the sidewalls of the gate pattern 230. For example, the first spacers 242 are formed using a nitride such as silicon nitride.

Figure 23:
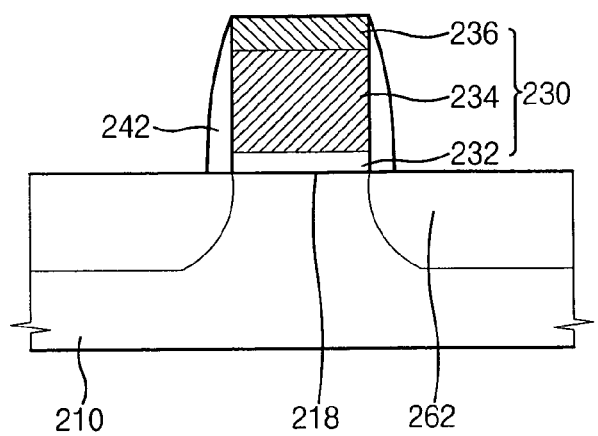

Referring to FIG. 23, halo dopants are implanted into portions of the semiconductor substrate 210 adjacent to both sides of the gate pattern 230 using the first spacers 242 as ion implantation masks, thereby forming preliminary halo implantation regions 262 at the portions of the substrate 210. The preliminary halo implantation regions 262 have conductivity types substantially identical to that of the semiconductor substrate 210. Before forming the preliminary halo implantation regions 262, impurities may be implanted into the portions of the substrate 210 with a relatively low concentration so that LDD regions (not shown) may be formed at the portions of the substrate 210.

Figure 24:
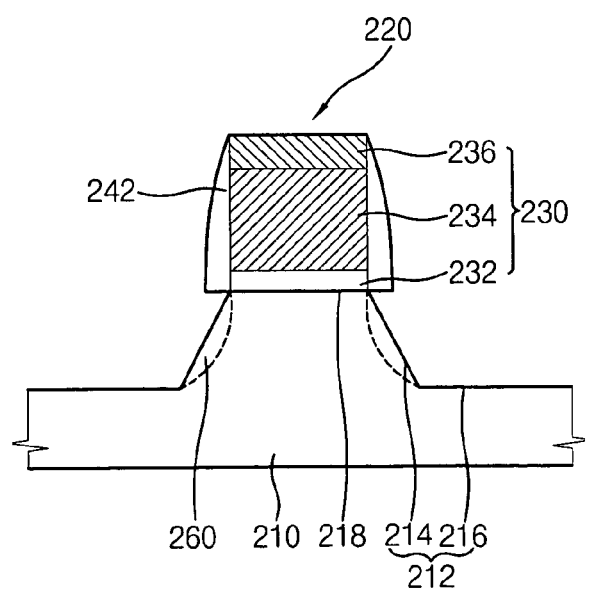

Referring to FIG. 24, the preliminary halo implantation regions 262 are partially etched using an etching gas to form recesses 212 having side faces 214 of the {111} crystal plane and bottom faces 216 of the {100} crystal plane. Simultaneously, halo implantation regions 260 are formed adjacent to the side faces 214 of the recesses 212. Bottom faces of the first spacers 242 are exposed through the recesses 212. The halo implantation regions 260 make contact with the side faces 214 of the recesses 212. The etching gas may include HCl and at least one of $GeH_4$, $SiH_4$ and $SiH_2Cl_2$. An etching process of etching the preliminary halo implantation regions 262 is carried out under etching conditions substantially identical to those of Embodiment 1.

Figure 25:
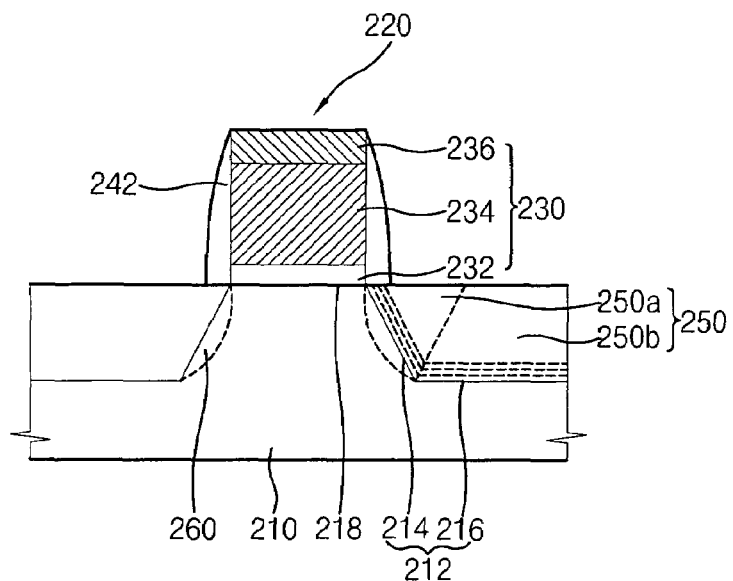

Referring to FIG. 25, a source gas containing silicon-germanium is introduced onto the recesses 212 so that silicon-germanium epitaxially grows from the side faces 214 and the bottom faces 216 of the recesses 212. Hence, the epitaxial layers 250 are formed to fill up the recesses 212. Because the recesses 212 have the side faces 214 of the {111} crystal plane and the bottom faces 216 of the {100} crystal plane, the epitaxial layers 250 have hetero structures in which first crystalline structures 250a grow from the side faces 214 in the [111] direction, and second crystalline structures 250b grow from the bottom faces 216 in the [100] direction, respectively.

The source gas containing silicon-germanium and the impurities including carbon, boron or phosphorous may be simultaneously introduced onto the recesses 212 to thereby form the epitaxial layers 250 doped with the impurities. The epitaxial layers 250 have boundaries substantially corresponding to those of the impurity regions.

Alternatively, the impurities including carbon, boron or phosphorous may be implanted into the epitaxial layers 250 to form the impurity regions 270 having side faces substantially different from those of the epitaxial layers 250. Each of the side faces of the impurity regions 270 is positioned between the central of the gate pattern 230 and the side face of the epitaxial layer 250.

Figure 26:
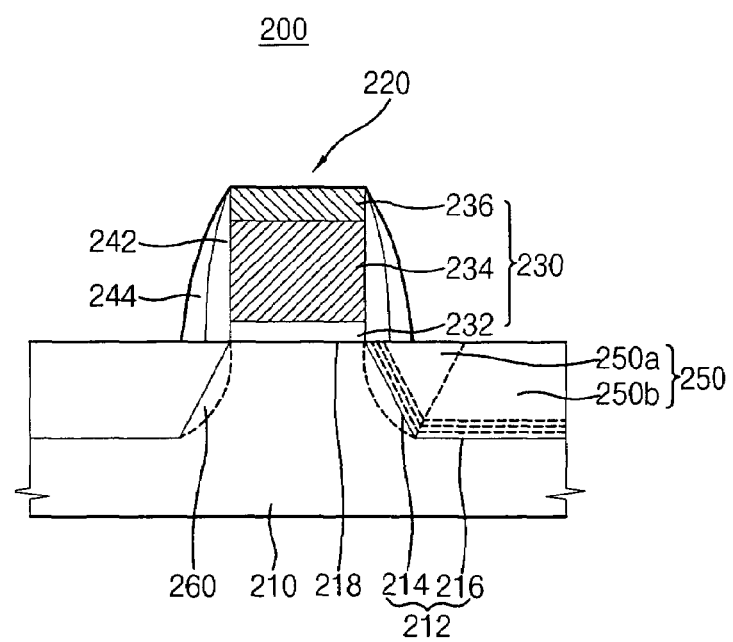

Referring to FIG. 26, the second spacers 244 are formed on the first spacers 242 to form the spacing members on the sidewalls of gate pattern 230. Each second spacer 244 is formed using a nitride such as silicon nitride. Thus, the gate structure 220 having the spacing members and the gate pattern 230 is formed on the substrate 210. The second spacers 244 are respectively positioned on the epitaxial layers 250. Then, the second spacers 244 are formed, and thus the transistor of the present embodiment is completed on the substrate 210.

Embodiment 7

A transistor 100b of a seventh embodiment of the present invention includes elements substantially identical to those of the transistor in Embodiment 1 except elevated epitaxial layers. Thus, any further detailed description concerning the transistor of the present embodiment will not be repeated.

Figure 27:
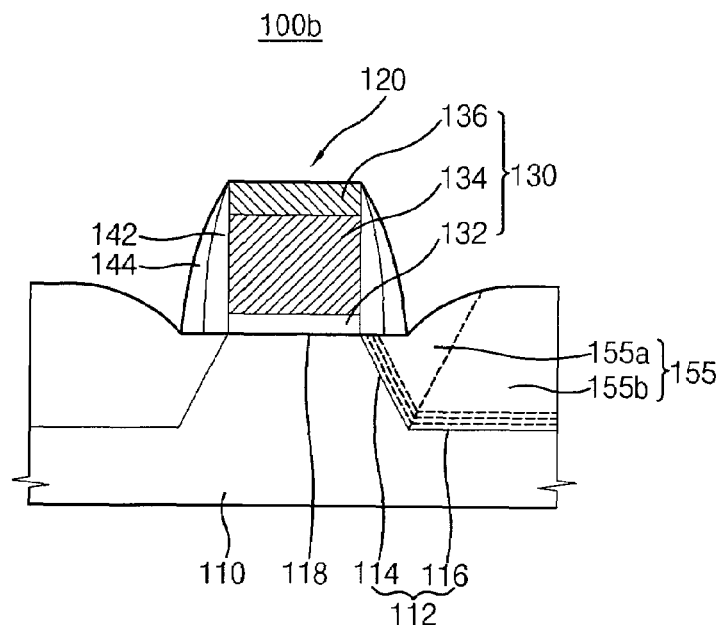
FIG. 27 is a cross sectional view illustrating a transistor in accordance with a seventh embodiment of the present invention.

FIG. 27 is a cross sectional view illustrating the transistor 100b in accordance with the present embodiment.

Referring to FIG. 27, the elevated epitaxial layers 155 have surfaces higher than a surface 118 of a semiconductor substrate 110 although the epitaxial layers 150 have surfaces substantially identical to the surface 118 of the semiconductor substrate 110 in Embodiment 1.

In the present embodiment, a method of manufacturing the transistor is substantially identical to the above method described with reference to FIGS. 2 to 4 except for a process for forming the elevated epitaxial layers 155.

Referring now to FIG. 27, a source gas containing silicon-germanium, for example, a gas including $GeH_4$, $SiH_4$ or $SiH_2Cl_2$ is introduced onto recesses 112 for a relatively long time in comparison with Embodiment 1. Silicon-germanium epitaxially grows from the side faces 114 and the bottom faces 116 of the recesses 112 so that the elevated epitaxial layers 155 are formed to fill up the recesses 112 and upwardly extended. Each of the elevated epitaxial layer 155 has a hetero structure in which a first crystalline structure 155a grows from the side face 114 in the [111] direction, and a second crystalline structure 155b grows from the bottom face 116 in the [100] direction. Also, the elevated epitaxial layers 155 have the surfaces higher than the surface 118 of the semiconductor substrate 110.

Alternatively, the source gas containing silicon-germanium and impurities including carbon, boron or phosphorous may be simultaneously introduced onto the recesses 112 to thereby form the elevated epitaxial layers 155 doped with the impurities.

As a result, the transistor 100b is formed on the substrate 110 to include impurity regions that have boundaries substantially corresponding to the side faces of the elevated epitaxial layers 155. The impurity regions may correspond to source/drain regions of the transistor 100b.

Alternatively, after the elevated epitaxial layers 155 are formed without doping the impurities therein as described above, the impurities are implanted into the elevated epitaxial layer 155 to thereby form elevated impurity regions corresponding to source/drain regions.

Embodiment 8

Figure 28:
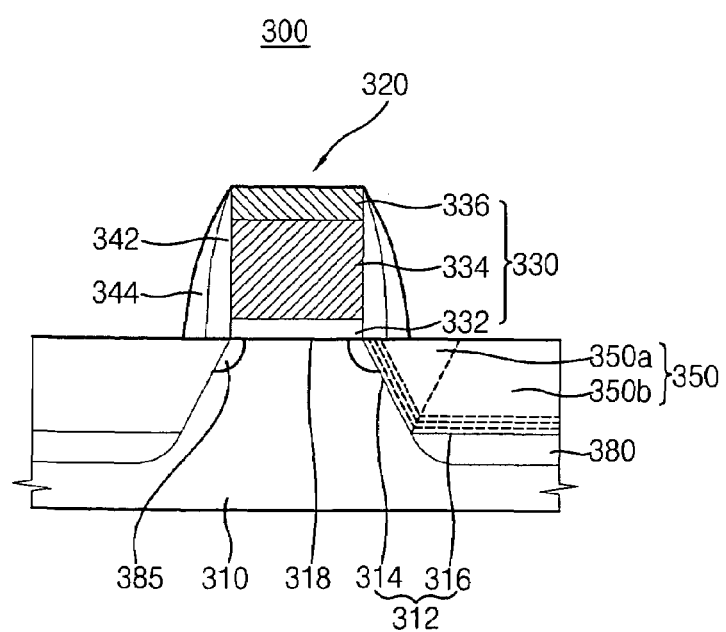
FIG. 28 is a cross sectional view illustrating a transistor in accordance with an eighth embodiment of the present invention.

FIG. 28 is a cross sectional view illustrating a transistor in accordance with an eighth embodiment of the present invention.

Referring to FIG. 28, a transistor 300 of the present embodiment includes a semiconductor substrate 310 such as a silicon (Si) substrate or a silicon-germanium (Si—Ge) substrate, a gate structure 320 formed on the semiconductor substrate 310, two epitaxial layers 350 formed at portions of the semiconductor substrate 310 adjacent to the gate structure 320, lightly doped impurity regions 385 formed at a side portion of the epitaxial layers 350, first heavily doped impurity regions 380 formed under the epitaxial layers 350, and second heavily doped impurity regions respectively formed in the epitaxial layers 350.

The semiconductor substrate 310 has a first surface 318 oriented along a {100} crystal plane, a second surface 316 oriented along the {100} crystal plane, and a third surface 314 oriented along a {111} crystal plane. The gate structure 320 is formed on the first surface 318 of the substrate 310.

Two recesses 312 are respectively formed at portions of the first surface 318 adjacent to the gate structure 320 to form the second surface 316 and the third surface 314. The recesses 312 include bottom faces and side faces, respectively. That is, the bottom faces of the recesses 312 correspond to the second surface 316 of the semiconductor substrate 310 and the side faces correspond to the third surface 314 of the semiconductor substrate 310. Each of the bottom faces 316 has a height substantially less than that of the first surface 318 of the semiconductor substrate 310. Each of the side faces 314 is between the bottom face 316 and the first surface 318 to connect the bottom face 316 to the first surface 318. Since the side face 314 is positioned along the {111} crystal plane, an angle between the side face 314 and the bottom face 316 is about 54.7°. For example, the angle may be no less than about 50° or about 54.7° in processes for forming the transistor 300. When the angle between the side face 314 and the bottom face 316 is preferably in a range of about 50 to about 65°, preferably about 54.7 to about 65°, the side face 314 may be regarded as including silicon substantially oriented along the {111} crystal plane.

The gate structure 320 includes a gate pattern 330 formed on the first surface 318 of the substrate 310, and spacing members formed on sidewalls of the gate pattern 330.

The gate pattern 330 includes a gate insulation layer pattern 332 formed on the first surface 318 of the substrate 310, a conductive layer pattern 334 formed on the gate insulation layer pattern 332, and a hard mask layer pattern 336 formed on the conductive layer pattern 334.

A portion of the first surface 318 of the substrate 310 beneath the gate insulation layer pattern 332 serves as a channel layer that selectively and electrically connects one impurity region to another impurity region.

The gate insulation layer pattern 332 may include silicon oxide, silicon oxynitride, metal oxide, metal oxynitride, etc. The conductive layer pattern 334 may include a metal such as tungsten (W), copper (Co), aluminum (Al), metal nitride, etc. In addition, the hard mask layer pattern 336 may include silicon nitride.

Each of the spacing members may have a double spacer structure. That is, each of the spacing members includes first spacers 342 and second spacers 344. The first spacers 342 are formed on the sidewalls of the gate pattern 330 and the second spacers 344 are positioned on the first spacers 342. Since the spacing members assure a sufficient channel length of the transistor 300, a short channel effect generated in the transistor 300 may be prevented. Particularly, the side faces 314 of the recesses 312 are between the gate pattern 330 and the second spacers 344. The first and second spacers 342 and 344 may include a substantially identical material, for example, silicon nitride. Alternatively, the first and second spacers 342 and 344 may include different materials from each other. For example, the first spacers 342 may include an oxide, whereas the second spacers 344 may include a nitride. Furthermore, each of the spacing members may have a single spacer structure.

The lightly doped impurity regions 385 have a first concentration. The lightly doped impurity regions 385 are positioned beneath the third surface 314 of the semiconductor substrate 310. Here, first impurities may be implanted into the third surface 314 to form the lightly doped impurity regions 385. Examples of the first impurities include carbon, boron, phosphorous, etc.

The first heavily doped impurity regions 380 are formed under the second surface 316 of the semiconductor substrate 310. The first heavily doped impurity regions 380 have a second concentration higher than the first concentration of the lightly doped impurity regions 385. Here, second impurities may be implanted into the second surface 316 to form the first heavily doped impurity regions 380. Examples of the second impurities include carbon, boron, phosphorous, etc.

The epitaxial layers 350 are formed in the recesses 312, respectively. The epitaxial layers 350 are positioned on the first heavily doped impurity regions 380, respectively. That is, the epitaxial layers 350 and the first heavily doped impurity regions 380 have the second surface 316 as an interface. The epitaxial layers 350 may include silicon germanium. Silicon germanium films grow from the side faces 314 and the bottom faces 316 of the recesses 312 to thereby form the epitaxial layers 350 filling up the recesses 312. As a result, each epitaxial layer 350 has a side face of the {111} crystal plane and a bottom face of the {100} crystal plane so that the epitaxial layer 350 may have a heterogeneous structure.

Third impurities are implanted into the epitaxial layers 350 to form the second heavily doped impurity regions having a third concentration in the epitaxial layers 350. The third impurities may include carbon (C), boron (B), phosphorous (P), etc. Also, the third concentration of the second heavily doped impurity regions is higher than the first concentration of the lightly doped impurity regions 385 and is substantially identical to the second concentration of the first heavily doped impurity regions 380. Further, the first heavily doped impurity region 380 and the second heavily doped impurity region are combined to form a single source/drain region. According to the present embodiment, each of the second heavily doped impurity regions has an area substantially identical to that of the epitaxial layer 350. Thus, each second heavily doped impurity region may have a side face substantially corresponding to that of the epitaxial layer 350.

Hereinafter, a method of manufacturing the transistor in FIG. 28 will be described in detail with reference to the accompanying drawings.

FIGS. 29 to 34 are cross sectional views illustrating the method of manufacturing the transistor in FIG. 28.

Figure 29:
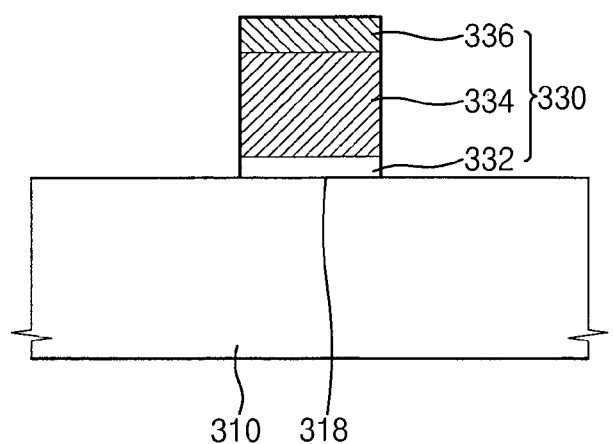
FIGS. 29 to 34 are cross sectional views illustrating a method of forming the transistor in FIG. 28.

Referring to FIG. 29, the gate pattern 330 is formed on the surface 318 of the {100} crystal plane. The substrate 310 may correspond to the silicon substrate or the silicon-germanium substrate. In particular, an insulation layer (not shown) is formed on the surface 318 of the substrate 310. The insulation layer may include an oxide. A conductive layer (not shown) is formed on the insulation layer. The conductive layer may include a metal such as tungsten. A hard mask layer (not shown) is formed on the conductive layer. The hard mask layer may include a nitride such as silicon nitride. A photoresist pattern (not shown) is formed on the hard mask layer. The hard mask layer, the conductive layer and the insulation layer are partially etched using the photoresist pattern as an etching mask to thereby form the gate pattern 330 on the surface 318 of the substrate 310. The gate pattern 330 includes the insulation layer pattern 332, the conductive layer pattern 334 and the hard mask layer pattern 336.

Figure 30:
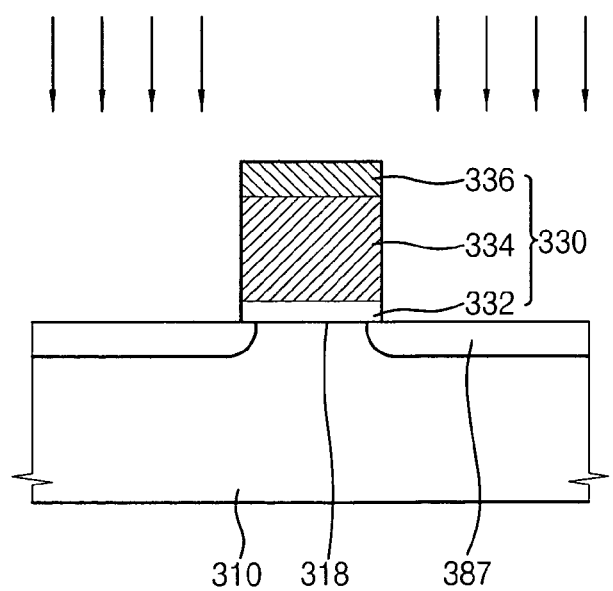

Referring to FIG. 30, first impurities are implanted into the surface 318 of the semiconductor substrate 310 using the gate pattern 330 as an ion implantation mask to form preliminary lightly doped impurity regions 387 having a first concentration. Here, examples of the first impurities include carbon, boron, phosphorous, etc.

Figure 31:
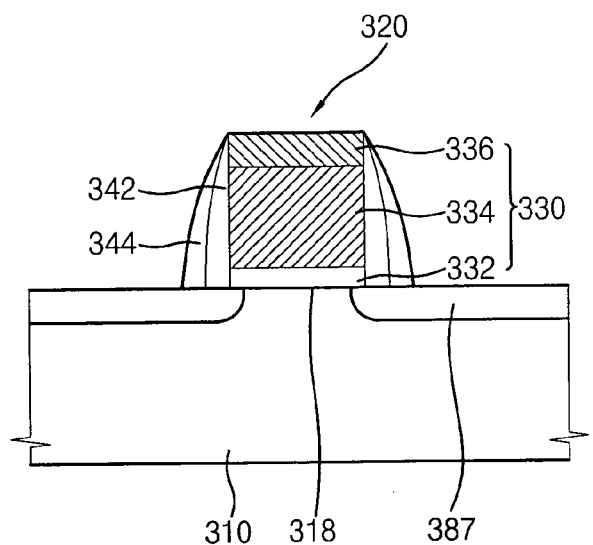

Referring to FIG. 31, a first nitride layer (not shown) is formed on the substrate 310 to cover the gate pattern 330. The first nitride layer is partially etched to form the first spacers 342 on the sidewalls of the gate pattern 330. A second nitride layer (not shown) is then formed on the substrate 310 to cover the gate pattern 330 and the first spacers 342. The second nitride layer is partially etched to form the second spacers 344 on the first spacers 342, respectively. As a result, the gate structure 320 including the gate pattern 330 and the spacing members is formed on the semiconductor substrate 310.

Figure 32:
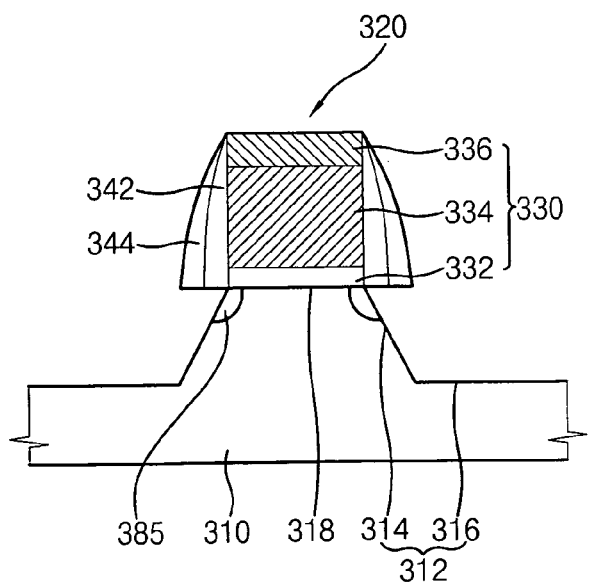

Referring to FIG. 32, the portions of the semiconductor substrate 310 adjacent to the both sides of the gate structure 320 are partially etched to form the recesses 312 that have the side faces 314 of the {111} crystal plane and the bottom faces 316 of the {100} crystal plane. The portions of the semiconductor substrate 310 may be etched by a dry etching process using an etching gas that includes hydrogen chloride (HCl). When the recesses 312 are formed, bottom faces of the first and second spacers 342 and 344 are exposed through the recesses 312. Also, the preliminary lightly doped impurity regions 387 are partially removed by the etching process to form the lightly doped impurity regions 385 under the gate structure 320. The lightly doped impurity regions 385 are partially exposed through the side faces 314 of the recesses 312.

The etching process for etching the portions of the substrate 310 may be carried out at a temperature of about 500 to about 850° C., preferably a temperature of about 500 to about 700° C. using an etching gas including the HCl gas and the gas containing hydrogen such as $GeH_4$, $SiH_4$, $SiH_2Cl_2$ gas, etc.

Figure 33:
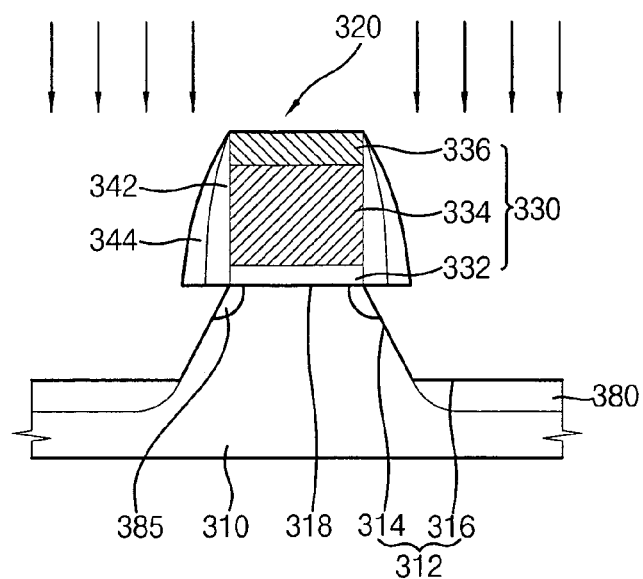

Referring to FIG. 33, second impurities are then implanted into the bottom faces 316 of the recesses 312 to form the first heavily doped impurity regions 380 having a second concentration higher than the first concentration. Examples of the second impurities include carbon, boron, phosphorous, etc.

Figure 34:
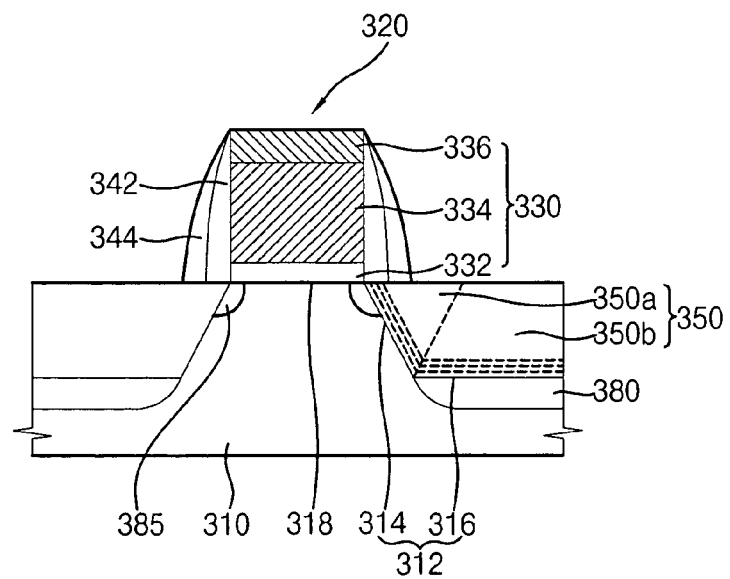

Referring to FIG. 34, a source gas containing silicon-germanium, for example, $GeH_4$, $SiH_4$ or $SiH_2Cl_2$ is introduced onto the recesses 312. Silicon-germanium in the source gas epitaxially grows from the side faces 314 and the bottom faces 316 of the recesses 312 to thereby form the epitaxial layers 350 respectively filling up the recesses 312. For example, the epitaxial layers 350 are formed to fill up the recesses 312 by a chemical vapor deposition (CVD) process. Here, since each recess 312 has the side face 314 of the {111} crystal plane and the bottom face 316 of the {100} crystal plane, each of the epitaxial layers 350 has a hetero crystalline structure in which a first crystalline structure 350a grows from the side face 314 along the [111] direction, and a second crystalline structure 350b grows from the bottom face 116 in the [100] direction.

Alternatively, the source gas containing silicon-germanium and the impurities including carbon, boron or phosphorous may be simultaneously introduced onto the recesses 312 to thereby form the epitaxial layers 350 doped with the impurities.

As a result, source/drain regions including the first heavily doped impurity regions 380 and the second heavily doped impurity regions are formed at both sides of the gate structure 320, thereby completing the transistor 300 in FIG. 28 that includes the second heavily doped impurity regions and the epitaxial layers 350 having a substantially identical side boundary.

Embodiment 9

A transistor of a ninth embodiment of the present invention has elements substantially identical to those of the transistor in FIG. 28 except impurity regions 370 having side faces substantially different from those of epitaxial layers 350 as shown in FIG. 28. The side faces of the impurity regions 370 are respectively positioned between a central portion of a gate pattern 330 and side faces of the epitaxial layers 350. Thus, any further detailed description concerning the transistor of the present embodiment will not be repeated.

Figure 35:
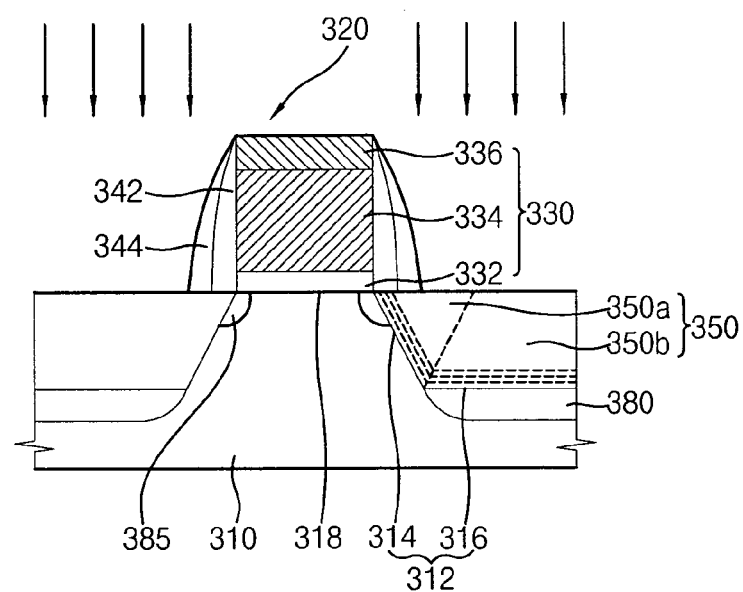
FIGS. 35 and 36 are cross sectional views illustrating a method of forming a transistor in accordance with a ninth embodiment of the present invention.
Figure 36:
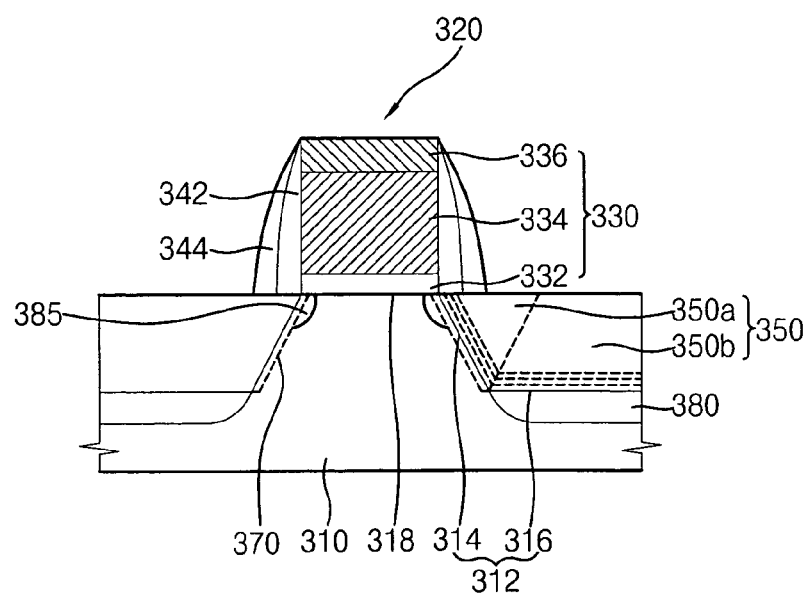

FIGS. 35 and 36 are cross sectional views illustrating a method for manufacturing the transistor in accordance with the present embodiment. In the present embodiment, processes for manufacturing the transistor are substantially identical to those described with reference to FIGS. 29 to 34 except for a process for forming the impurity regions 370.

Referring to FIG. 35, third impurities including carbon, boron, phosphorous, etc, are implanted into the epitaxial layers 350 by an ion implantation process as shown by the arrows in the figure. In Embodiment 8, the source gas and the impurities are simultaneously provided in recesses 312 to form the epitaxial layers 350 doped with the impurities in Embodiment 8. However, according to the present embodiment, after undoped epitaxial layers 350 grow to fill up the recesses 312, the impurities are additionally implanted into the undoped epitaxial layers 350.

Referring to FIG. 36, the substrate 310 having the epitaxial layers 350 is annealed so that the impurities in the epitaxial layers 350 diffuse to form the second heavily doped impurity regions 370, thereby completing the transistor of the present embodiment.

As described above, the second heavily doped impurity regions 370 have the side faces substantially different from those of the epitaxial layers 350. Each of the side faces of the impurity regions 370 is positioned between the central portion of the gate pattern 330 and the side face of the epitaxial layer 350. The second heavily doped impurity regions 370 having such side faces are formed by diffusing the impurities into the substrate 310 through a heat treatment process for annealing the substrate 310. Alternatively, the second heavily doped impurity regions 370 may have side faces substantially identical to those of the epitaxial layers 350 as described above.

Embodiment 10

A transistor of a tenth embodiment of the present invention has a structure substantially identical to that of the transistor in FIG. 8. Thus, a method of manufacturing the transistor of the present embodiment will be described with reference to FIGS. 37 to 43.

FIGS. 37 to 43 are cross sectional views illustrating the method of manufacturing the transistor according to the tenth embodiment of the present invention. In the present embodiment, after first spacers 342 are formed on sidewalls of a gate pattern 330, epitaxial layers 350 are formed in recesses 312 before second spacers 344 are formed on the first spacers 342.

Figure 37:
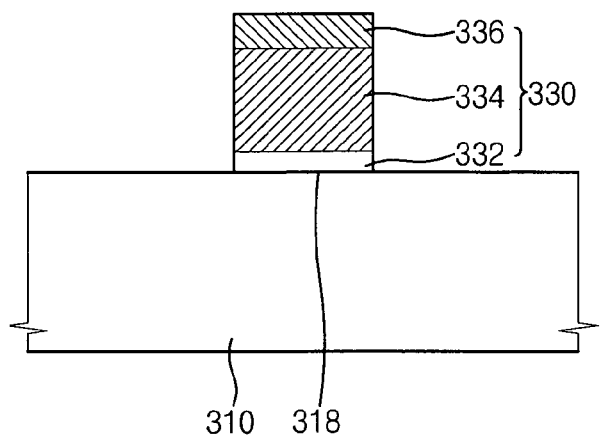
FIGS. 37 to 43 are cross sectional views illustrating a method of forming a transistor in accordance with a tenth embodiment of the present invention.

Referring to FIG. 37, the gate pattern 330 including an insulation layer pattern 332, a conductive layer pattern 334 and a hard mask layer pattern 336 are formed on a surface 318 of a semiconductor substrate 310.

Figure 38:
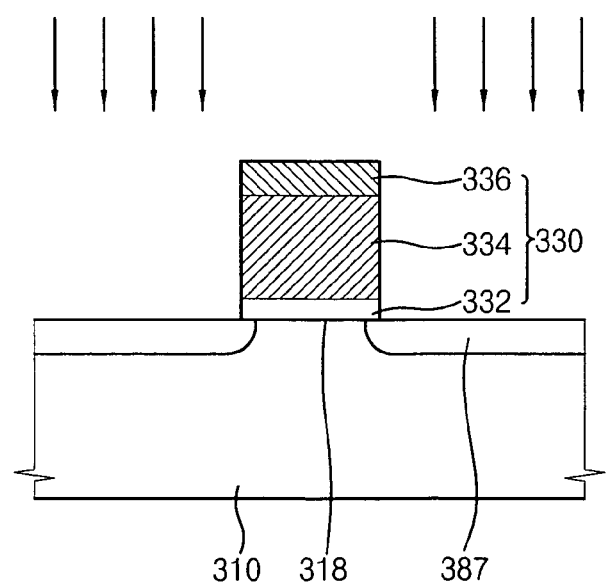

Referring to FIG. 38, first impurities are implanted into the surface 318 of the semiconductor substrate 310 using the gate pattern 330 as an ion implantation mask to form preliminary lightly doped impurity regions 387.

Figure 39:
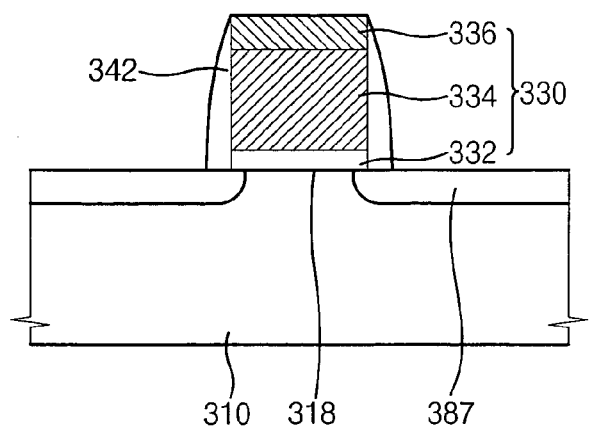

Referring to FIG. 39, the first spacers 342 including nitride are formed on the sidewalls of the gate pattern 330, respectively.

Figure 40:
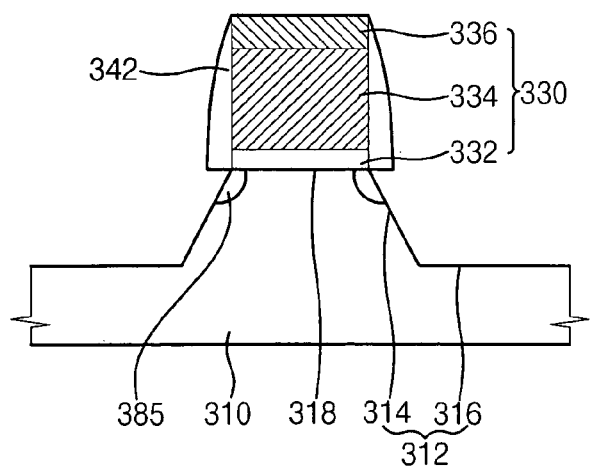

Referring to FIG. 40, portions of the surface 318 adjacent to both sides of the gate pattern 330 are etched to thereby form the recesses 312 at the portions of the surface 318. The recesses 312 may be formed by a dry etching process using an etching gas. The etching gas may include HCl and one of $GeH_4$, $SiH_4$ and $SiH_2Cl_2$. The dry etching process for forming the recesses 312 may be carried out under etching conditions substantially identical to those described in Embodiment 8. The recesses 312 have side faces 314 of the {111} crystal plane and bottom faces 316 of the {100} crystal plane. When the recesses 312 are formed by partially etching the substrate 310, the preliminary lightly doped impurity regions 387 are partially removed to form the lightly doped impurity regions 385 under the gate pattern 330. Here, bottom faces of the first spacers 342 are exposed through the recesses 312. Also, the lightly doped impurity regions 385 are partially exposed through the side faces 314 of the recesses 312.

Figure 41:
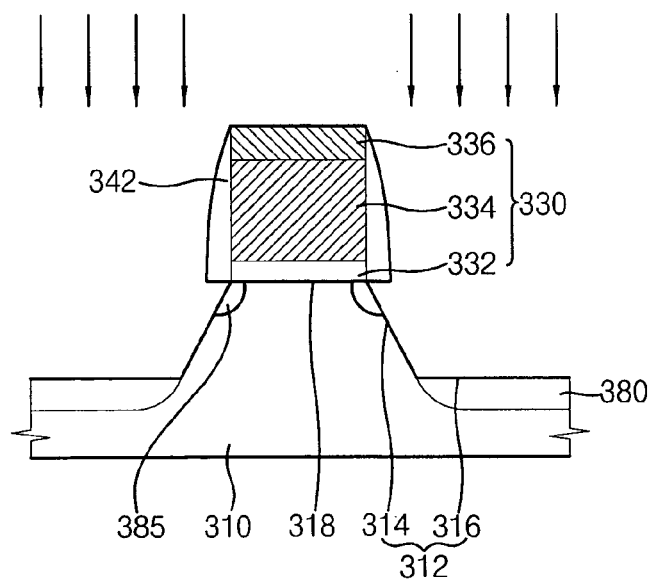

Referring to FIG. 41, second impurities are implanted into the bottom faces 316 of the recesses 312 to form the first heavily doped impurity regions 380 having a second concentration higher than the first concentration. Examples of the second impurities include carbon, boron, phosphorous, etc.

Figure 42:
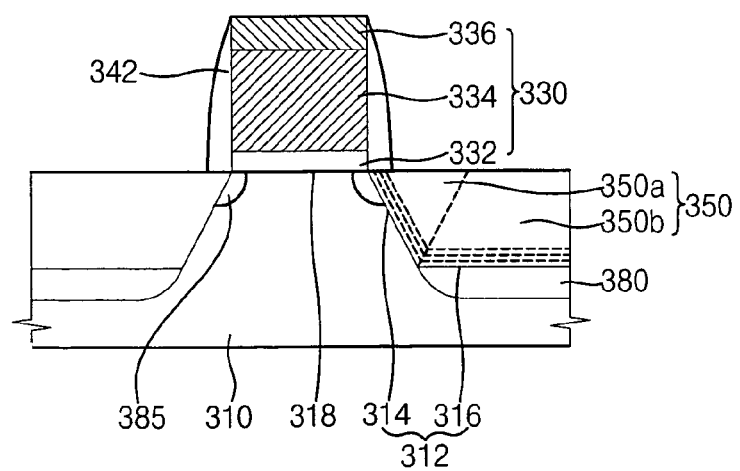

Referring to FIG. 42, a source gas containing silicon-germanium is introduced onto the recesses 312. Silicon-germanium epitaxially grows from the side faces 314 and the bottom faces 316 of the recesses 312 to thereby form the epitaxial layers 350 in the recesses 312, respectively. Since each recess 312 has the side face 314 of the {111} crystal plane and the bottom face 316 of the {100} crystal plane, each of the epitaxial layers 350 has a hetero structure in which a first crystalline structure 350a grows from the side face 314 in the [111] direction, and a second crystalline structure 350b grows from the bottom face 316 in the [100] direction. Alternatively, the source gas containing silicon-germanium and impurities including carbon, boron or phosphorous may be simultaneously introduced onto the recesses 312 to form the epitaxial layers 350 doped with the impurities.

Figure 43:
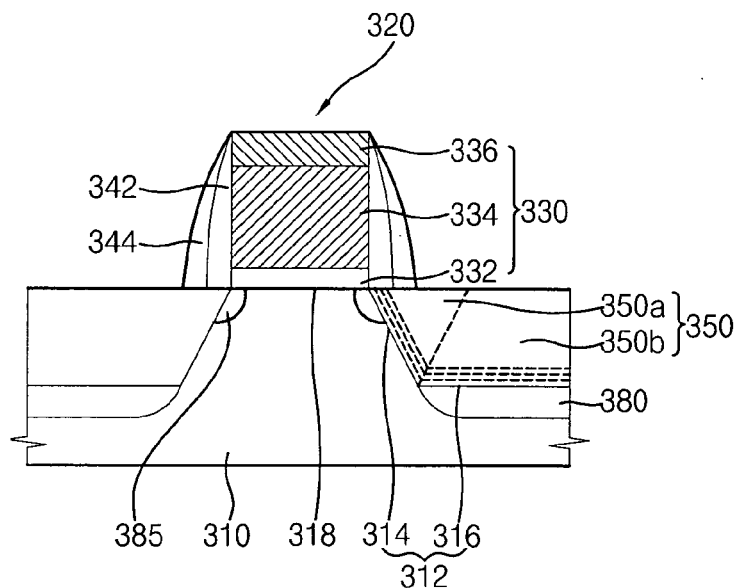

Referring to FIG. 43, the second spacers 344 including nitride are respectively formed on the first spacers 342 to form spacing members on the sidewalls of the gate pattern 330. The spacing members include the first spacers 342 and the second spacers 344. Thus, a gate structure 320 including the gate pattern 330 and the spacing members are formed on the substrate 310. Bottom portions of the second spacers 344 are respectively positioned on the epitaxial layers 350. Therefore, impurity regions of the transistor have boundaries substantially identical to those of the epitaxial layers 350. Particularly, each of the impurity regions has a side face substantially corresponding to that of the epitaxial layer 350.

Alternatively, the impurities including carbon, boron or phosphorous may be implanted into the epitaxial layers 350 to form the impurity regions having the side faces different from those of the epitaxial layers 350. Each side face of the impurity region is positioned between a central portion of the gate pattern 330 and the side face of the epitaxial layer 350.

Embodiment 11

Figure 44:
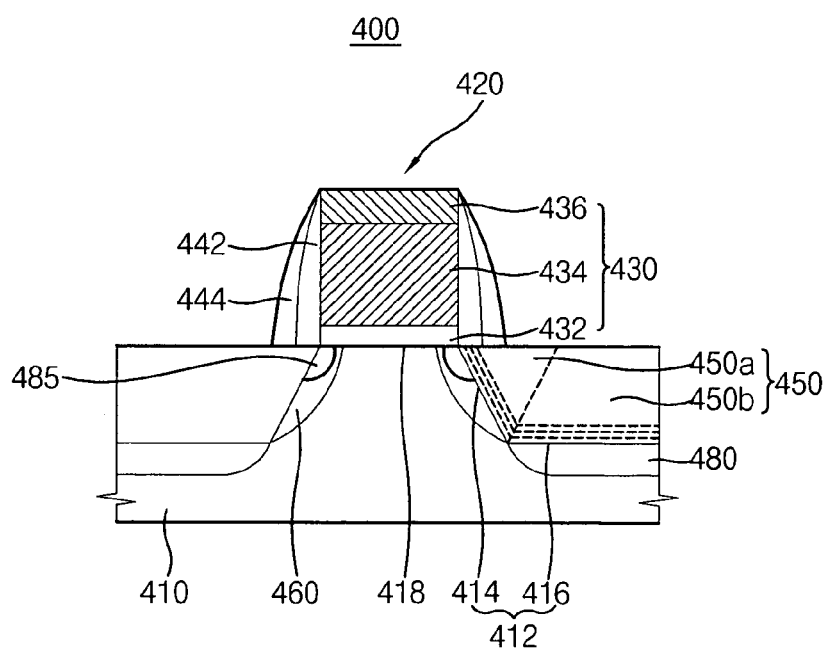
FIG. 44 is a cross sectional view illustrating a transistor in accordance with an eleventh embodiment of the present invention.

FIG. 44 is a cross sectional view illustrating a transistor in accordance with an eleventh embodiment of the present invention.

Referring to FIG. 44, a transistor 400 of an eleventh embodiment of the present invention includes a semiconductor substrate 410, a gate structure 420 formed on the semiconductor substrate 410, two epitaxial layers 450 formed adjacent to both sides of the gate structure 420, lightly doped impurity regions 485 formed at side portions of the epitaxial layers 450, first heavily doped impurity regions 480 formed under the epitaxial layers 450, second heavily doped impurity regions formed in the epitaxial layers 450, and halo implantation regions 460.

The semiconductor substrate 410 has a first surface 418 of the {100} crystal plane, a second surface 416 of the {100} crystal plane having a height lower than that of the first surface 418, and a third surface 414 of the {111} crystal plane connecting the first surface 418 to the second surface 416. Two recesses 412 are formed at portions of the first surface 418 adjacent to sidewalls of the gate structure 420. Each of the recesses 412 includes a bottom face 416 corresponding to the second surface 416 and a side face 414 corresponding to the third face 414. Thus, the bottom face 416 has a height substantially less than that of the first surface 418.

The gate structure 420 includes a gate pattern 430 formed on the surface 418, and spacing members formed on sidewalls of the gate pattern 430. The gate pattern 430 includes a gate insulation layer pattern 432 formed on the surface 418, a conductive layer pattern 434 formed on the gate insulation layer pattern 432, and a hard mask layer pattern 436 formed on the conductive layer pattern 434. The spacing members may have dual spacer structures that include first spacers 442 formed on the sidewalls of the gate pattern 430, and second spacers 444 formed on the first spacers 442. Each side face 414 of the recess 412 is positioned between a central portion of the gate pattern 430 and the second spacer 444.

The lightly doped impurity regions 485 are formed under the third surface 414 of the semiconductor substrate 410. The lightly doped impurity regions 485 have a first concentration. Here, first impurities may be implanted into the third surface 414 to form the lightly doped impurity regions 485. Examples of the first impurities include carbon, boron, phosphorous, etc.

The first heavily doped impurity regions 480 are formed under the second surface 416 of the semiconductor substrate 410. The first heavily doped impurity regions 480 have a second concentration higher that the first concentration. Here, second impurities may be implanted into the second surface 416 to form the first heavily doped impurity regions 480. Examples of the second impurities include carbon, boron, phosphorous, etc.

The epitaxial layers 450 including silicon-germanium are formed in the recesses 412. The epitaxial layers 450 have side faces of the {111} crystal plane and bottom faces of the {100} crystal plane, respectively.

Third impurities are implanted into the epitaxial layers 450 to form the second heavily doped impurity regions in the epitaxial layers 450. The second heavily doped impurity regions of the present embodiment have side faces substantially corresponding to those of the epitaxial layers 450.

The halo implantation regions 460 are formed in portions of the semiconductor substrate 410 adjacent to the side faces 414 of the recesses 412. Thus, the halo implantation regions 460 partially make contact with the side faces of the epitaxial layers 450. The halo implantation regions 460 have conductivity types substantially different from those of the impurity regions to thereby prevent impurities in the impurity regions from diffusing into the semiconductor substrate 410.

Hereinafter, a method of forming the transistor in FIG. 44 will be described in detail with reference to FIGS. 45 to 51.

FIGS. 45 to 51 are cross sectional views illustrating the method of manufacturing the transistor in accordance with the present embodiment.

Figure 45:
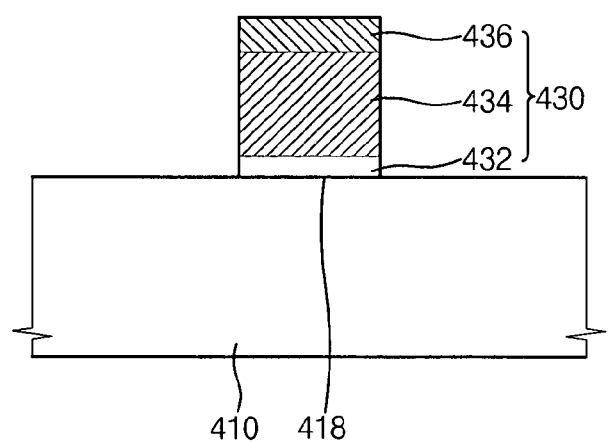
FIGS. 45 to 51 are cross sectional views illustrating a method of forming the transistor in FIG. 44.

Referring to FIG. 45, the gate pattern 430 including the gate insulation layer pattern 432, the conductive layer pattern 434 and the hard mask layer pattern 436 is formed on the surface 418 including silicon arranged along the {100} crystal plane as described above.

Figure 46:
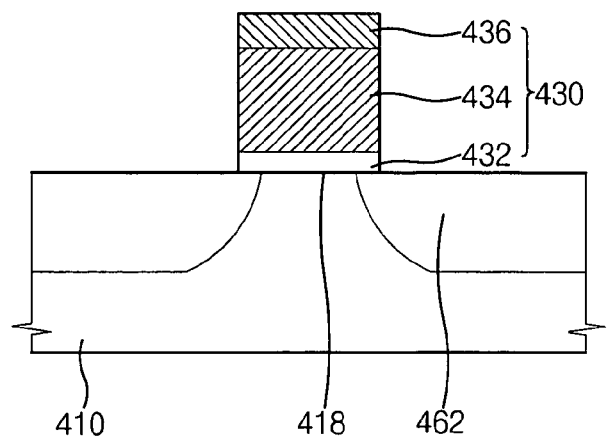

Referring to FIG. 46, halo dopants are implanted into the portions of the semiconductor substrate 410 adjacent to both sides of the gate pattern 430 so that preliminary halo implantation regions 462 are formed at the portions of the substrate 410. The preliminary halo implantation regions 462 have conductivity types substantially corresponding to that of the semiconductor substrate 410.

Figure 47:
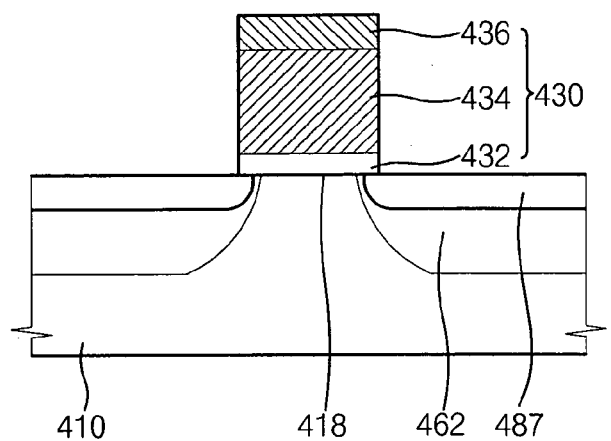

Referring to FIG. 47, first impurities are implanted into the surface 418 of the semiconductor substrate 410 using the gate pattern 430 as an ion implantation mask to form preliminary lightly doped impurity regions 487 having a first concentration. The preliminary lightly doped impurity regions 487 are positioned in the preliminary halo implantation regions 462.

Figure 48:
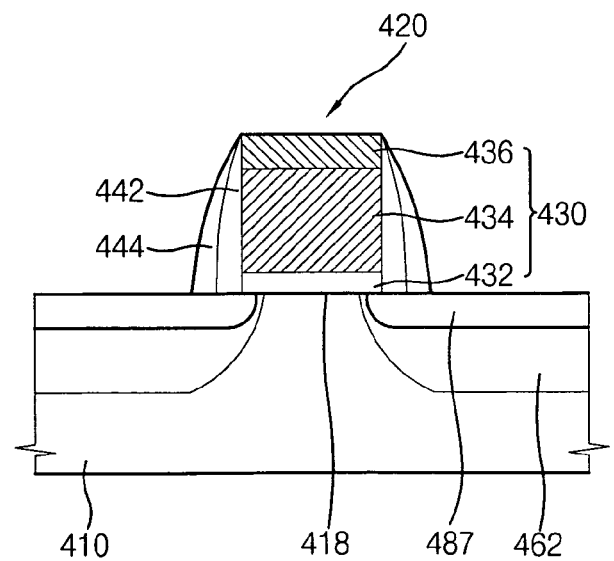

Referring to FIG. 48, the first spacers 442 are formed on the sidewalls of the gate pattern 430. Then, the second spacers 444 are formed on the first spacers 442 to form the spacing members on the sidewalls of the gate pattern 430. The first and second spacers 442 and 444 may include a nitride such as silicon nitride. Hence, the gate structure 420 including the gate pattern 430 and the first and second spacers 442 and 444 is formed on the substrate 410.

Figure 49:
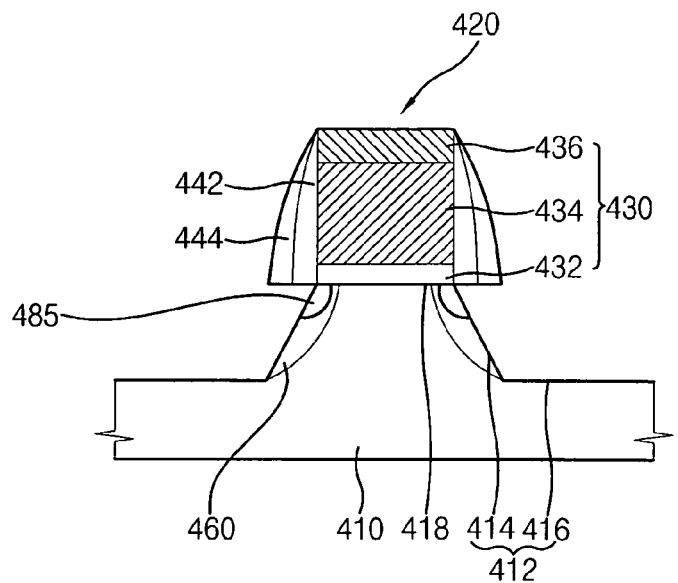

Referring to FIG. 49, the preliminary halo implantation regions 462 and the preliminary lightly doped impurity regions 487 are partially etched to form the recesses 412 having the side faces 414 of the {111} crystal plane and the bottom faces 416 of the {100} crystal plane, the halo implantation regions 460 and the lightly doped impurity regions 485. Here, the halo implantation regions 460 are formed adjacent to the side faces 414 of the recesses 412. That is, remaining preliminary halo implantation regions 462 respectively correspond to the halo implantation regions 460. When the recesses 412 are formed, bottom faces of the first and second spacers 442 and 444 are exposed through the recesses 412. Also, the halo implantation regions 460 and the lightly doped impurity regions 485 are exposed through the recesses 412. The lightly doped impurity regions 485 are located in the halo implantation regions 460.

Here, the preliminary halo implantation regions 462 may be etched using an etching gas that includes HCl and at least one of $GeH_4$, $SiH_4$ and $SiH_2Cl_2$. The etching process of etching the preliminary halo implantation regions 462 is performed under an etching condition substantially identical to that of the etching process according to Embodiment 8.

In the present embodiment, a chemical reaction between silicon and HCl in the preliminary halo implantation regions 462 may more actively occur in comparison with other portions of the semiconductor substrate 410 in which the halo dopants do not exist. The preliminary halo implantation regions 462 may be rapidly etched in a vertical direction relative to the substrate 410 so that a time of forming the recesses 412 in the preliminary halo implantation regions 462 may be shortened along the vertical direction. As a result, the side faces 414 of the {111} crystal plane may be readily formed beneath the spacing members.

Figure 50:
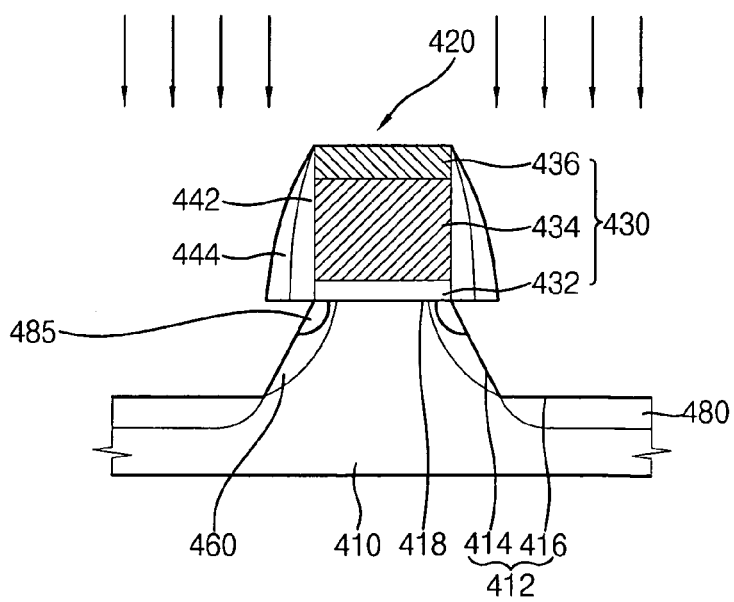

Referring to FIG. 50, second impurities are implanted into the bottom faces 416 of the recesses 412 to form the first heavily doped impurity regions 480 having a second concentration higher than the first concentration. Examples of the second impurities include carbon, boron, phosphorous, etc.

Figure 51:
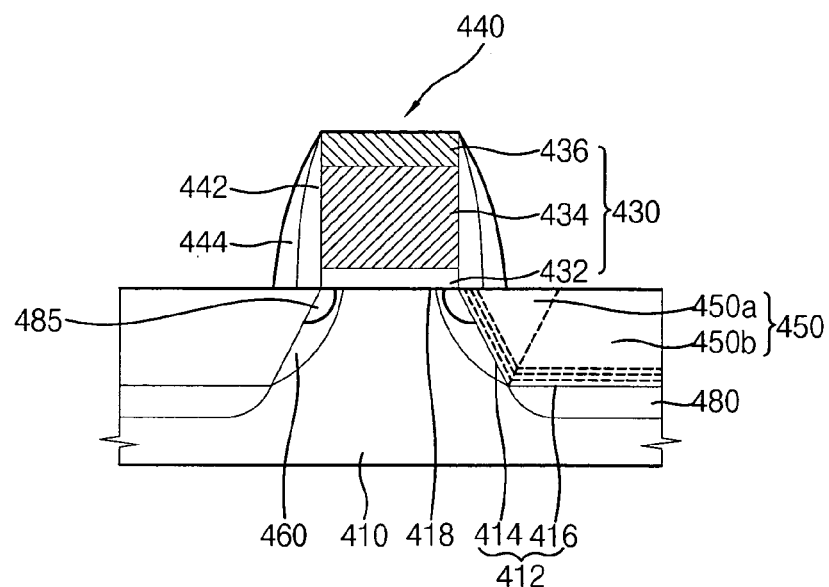

Referring to FIG. 51, a source gas including silicon-germanium is introduced onto the recess 412. Silicon-germanium epitaxially grows from the side faces 414 and the bottom faces 416 of the recesses 412 to respectively form the epitaxial layers 450 in the recesses 412. Since the recesses 412 have the side faces 414 of the {111} crystal plane and the bottom faces 416 of the {100} crystal plane, the epitaxial layers 450 have hetero structures in which first crystalline structures 450a grow from the side faces 414 in the [111] direction, and second crystalline structures 450b grow from the bottom faces 416 in the [100] direction. The source gas containing silicon-germanium and the third impurities including carbon, boron or phosphorous may be simultaneously introduced onto the recesses 412 to thereby form the epitaxial layers 450 doped with the impurities.

As a result, the second heavily doped impurity regions of the transistor 400 have boundaries substantially corresponding to the side faces of the epitaxial layers 450.

Each of the second heavily doped impurity regions has a conductivity type different from that of the halo implantation region 460. For example, when the halo implantation regions 460 have P types, the second heavily doped impurity regions have N types and vice versa. Since the halo implantation regions 460 have conductivity types different from those of the second heavily doped impurity regions, the halo implantation regions 460 suppress the diffusion of the third impurities into the semiconductor substrate 410. Thus, a short channel effect of the transistor 400 generated by adjacently disposing a source region and a drain region of the transistor 400 may be effectively prevented.

Embodiment 12

A transistor of a twelfth embodiment of the present invention has elements substantially identical to those of the transistor in FIG. 44 except impurity regions 470 having side faces different from those of epitaxial layers 450. Each side face of the impurity region 470 is positioned between a central portion of a gate pattern 430 and side faces of the epitaxial layers 450. Thus, any further detailed description of the transistor of the present embodiment will not be repeated.

Figure 52:
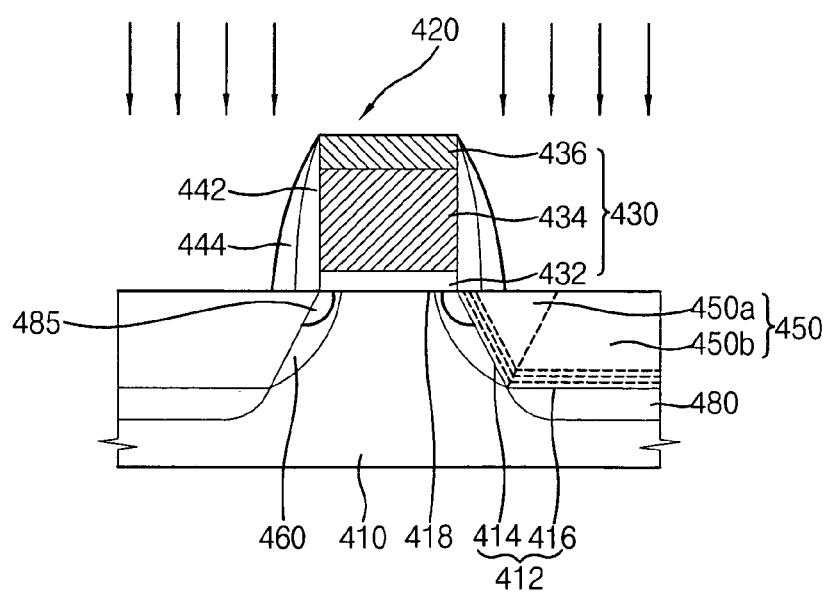
FIGS. 52 and 53 are cross sectional views illustrating a method of forming a transistor in accordance with a twelfth embodiment of the present invention.
Figure 53:
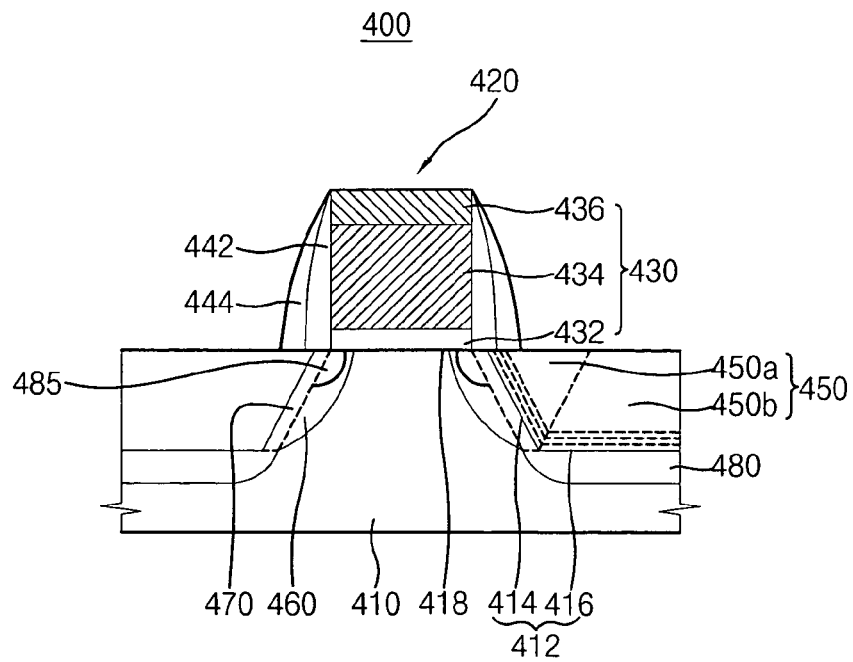

FIGS. 52 and 53 are cross sectional views illustrating a method of manufacturing the transistor according to the present embodiment. In the present embodiment, processes of forming the transistor are substantially identical to those of the eleventh embodiment illustrated with reference to FIGS. 45 to 51 except for a process for forming impurity regions 470. Therefore, processes after forming epitaxial layers 450 will be described in detail.

Referring to FIG. 52, third impurities including carbon, boron or phosphorous are implanted into the epitaxial layers 450 by an ion implantation process. In Embodiment 11, the source gas and the impurities are simultaneously provided onto the recesses 412 to form the doped epitaxial layers 450. However, according to the present embodiment, after undoped epitaxial layers 450 grow to fill up the recesses 412, the impurities are implanted into the undoped epitaxial layers 450.

Referring to FIG. 53, a substrate 410 having the doped epitaxial layers 450 is thermally treated to form the second heavily doped impurity regions 470 in the epitaxial layers 450, respectively. The second heavily doped impurity regions 470 correspond to source/drain regions of the transistor. When the second heavily doped impurity regions 470 are formed adjacent to both sides of a gate structure 420, the transistor is completed on the substrate 410.

In the present embodiment, the second heavily doped impurity regions 470 have side faces different from those of the epitaxial layers 450 as described above. That is, each side face of the second heavily doped impurity region 470 is positioned between a central portion of a gate pattern 430 and the side face of the epitaxial layer 450. The second heavily doped impurity regions 470 having such side faces are formed by diffusing the impurities into the semiconductor substrate 410 through an annealing process for thermally treating the substrate 410. Alternatively, the second heavily doped impurity regions 470 may have side faces substantially corresponding to those of the epitaxial layers 450.

Embodiment 13

A transistor of a thirteenth embodiment of the present invention has a structure substantially identical to that of the transistor in FIG. 44. Thus, any further detailed description with regard to the structure of the transistor will not be repeated.

FIGS. 54 to 61 are cross sectional views illustrating a method of manufacturing the transistor in accordance with the present embodiment. In the present embodiment, after first spacers 442 are formed on sidewalls of a gate pattern 430, epitaxial layers 450 are formed before second spacers 444 are formed on the first spacers 442.

Figure 54:
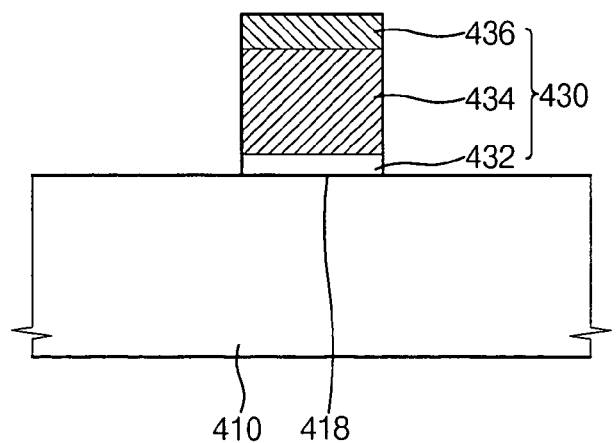
FIGS. 54 to 61 are cross sectional views illustrating a method of forming a transistor in accordance with a thirteenth embodiment of the present invention.

Referring to FIG. 54, the gate pattern 430 including a gate insulation layer pattern 432, a conductive layer pattern 434 and a hard mask layer pattern 436 is formed on a surface 418 of a semiconductor substrate 410. The surface 418 includes silicon oriented along the {100} crystal plane.

Figure 55:
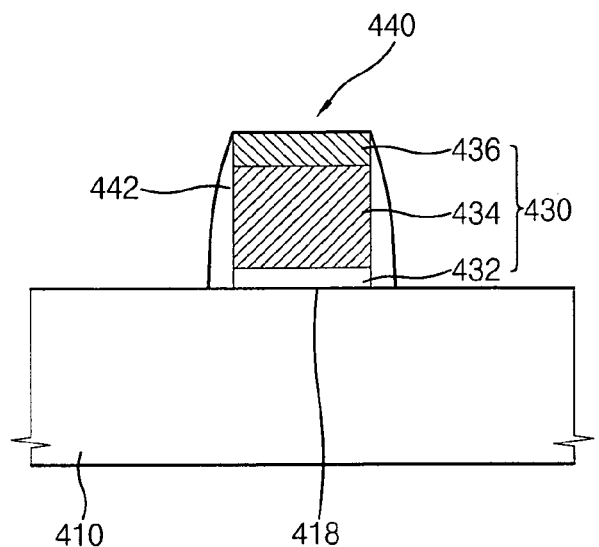

Referring to FIG. 55, the first spacers 442 including silicon nitride are respectively formed on the sidewalls of the gate pattern 430.

Figure 56:
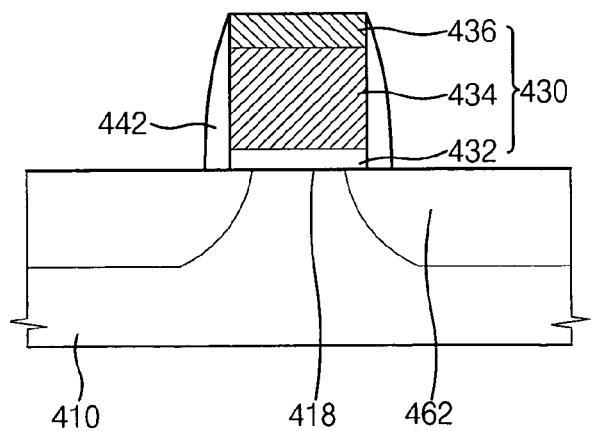

Referring to FIG. 56, halo dopants are implanted into portions of the semiconductor substrate 410 adjacent to both sides of the gate pattern 430 using the first spacers 442 as ion implantation masks, thereby forming preliminary halo implantation regions 462 at the portions of the substrate 410. The preliminary halo implantation regions 462 have conductivity types substantially identical to that of the semiconductor substrate 410.

Figure 57:
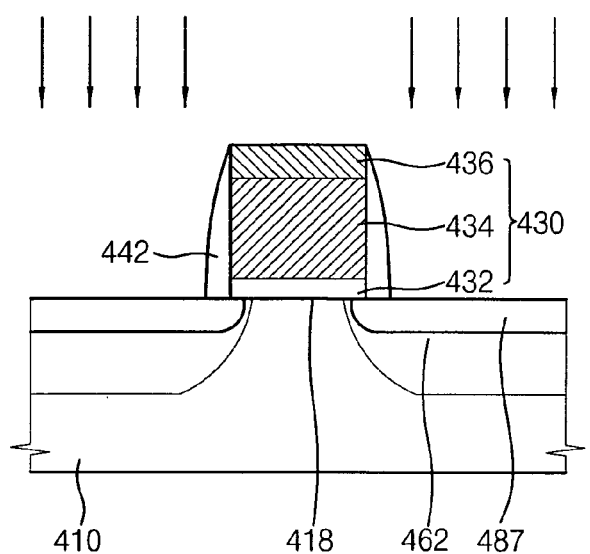

Referring to FIG. 57, first impurities are implanted into the surface 418 of the semiconductor substrate 410 using the gate pattern 430 as an ion implantation mask to form preliminary lightly doped impurity regions 487 having a first concentration. Here, the preliminary lightly doped impurity regions 487 are located in the preliminary halo implantation regions 462, respectively.

Figure 58:
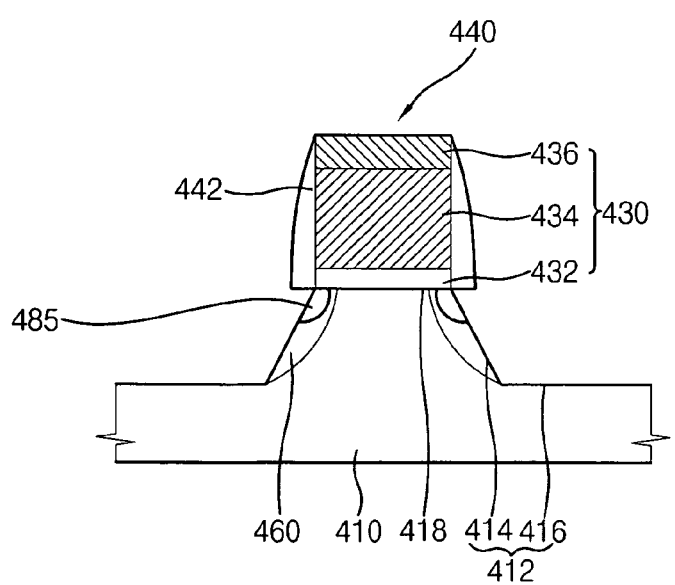

Referring to FIG. 58, the preliminary halo implantation regions 462 and the preliminary lightly doped impurity regions 487 are partially etched using an etching gas to form recesses 412 having side faces 414 of the {111} crystal plane and bottom faces 416 of the {100} crystal plane. Simultaneously, halo implantation regions 460 are formed adjacent to the side faces 414 of the recesses 412, and lightly doped impurity regions 485 are formed in the halo implantation regions 460. Here, bottom faces of the first spacers 442 are exposed through the recesses 412. The halo implantation regions 460 and the lightly doped impurity regions 485 make contact with the side faces 414 of the recesses 412. The etching gas may include HCl and at least one of $GeH_4$, $SiH_4$ and $SiH_2Cl_2$. An etching process of etching the preliminary halo implantation regions 462 and the preliminary lightly doped impurity regions 487 is carried out under etching conditions substantially identical to those of Embodiment 8.

Figure 59:
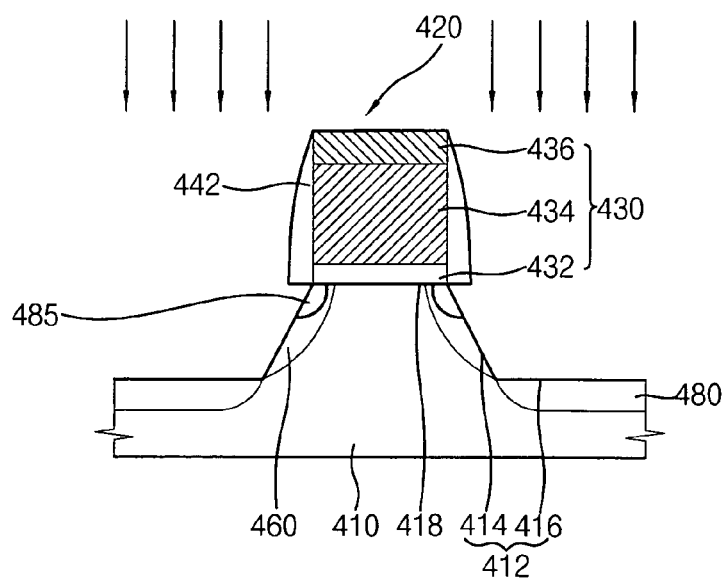

Referring to FIG. 59, second impurities are implanted into the bottom faces 416 of the recesses 412 to form the first heavily doped impurity regions 480 having a second concentration higher than the first concentration. Examples of the second impurities include carbon, boron, phosphorous, etc.

Figure 60:
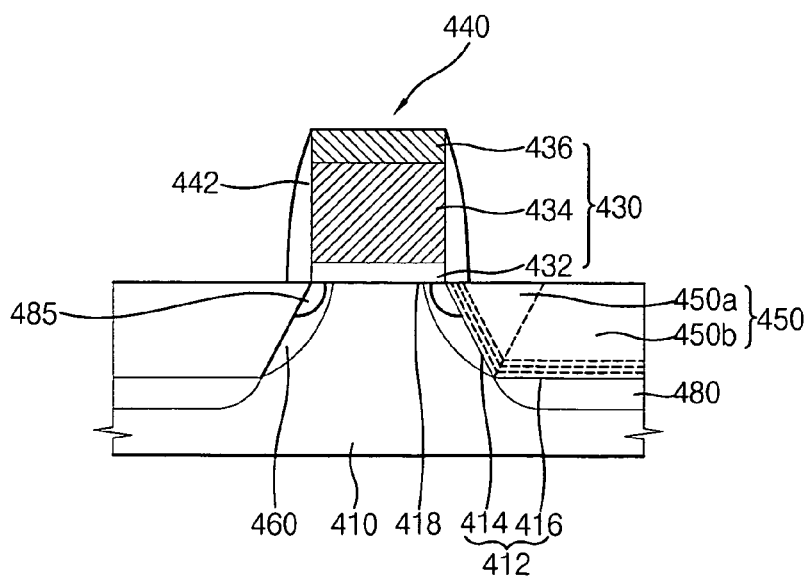

Referring to FIG. 60, a source gas containing silicon-germanium is introduced onto the recesses 412 so that silicon-germanium epitaxially grows from the side faces 414 and the bottom faces 416 of the recesses 412. Hence, the epitaxial layers 450 are formed to fill up the recesses 412. Because the recesses 412 have the side faces 414 of the {111} crystal plane and the bottom faces 416 of the {100} crystal plane, the epitaxial layers 450 have hetero structures in which first crystalline structures 450a grow from the side faces 414 in the [111] direction, and second crystalline structures 450b grow from the bottom faces 416 in the [100] direction, respectively.

The source gas containing silicon-germanium and the third impurities including carbon, boron or phosphorous may be simultaneously introduced onto the recesses 412 to thereby form the epitaxial layers 450 doped with the third impurities. The epitaxial layers 450 have boundaries substantially corresponding to those of the second heavily doped impurity regions.

Alternatively, the third impurities including carbon, boron or phosphorous may be implanted into the epitaxial layers 450 to form the second heavily doped impurity regions 470 having side faces substantially different from those of the epitaxial layers 450. Each of the side faces of the second heavily doped impurity regions 470 is positioned between the central of the gate pattern 430 and the side face of the epitaxial layer 450.

Figure 61:
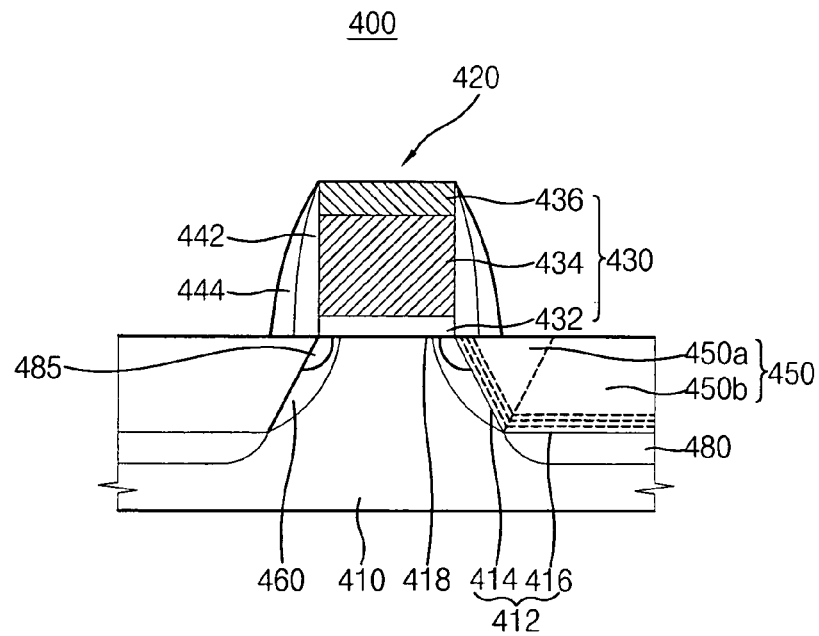

Referring to FIG. 61, the second spacers 444 are formed on the first spacers 442 to form the spacing members on the sidewalls of gate pattern 430. Each second spacer 444 is formed using a nitride such as silicon nitride. Thus, the gate structure 420 having the spacing members and the gate pattern 430 is formed on the substrate 410. The second spacers 444 are respectively positioned on the epitaxial layers 450. Then, the second spacers 444 are formed, and thus the transistor of the present embodiment is completed on the substrate 410.

Embodiment 14

A transistor 300a of a fourteenth embodiment of the present invention includes elements substantially identical to those of the transistor 300 in Embodiment 8 except elevated epitaxial layers. Thus, any further detailed description concerning the transistor 300a of the present embodiment will not be repeated.

Figure 62:
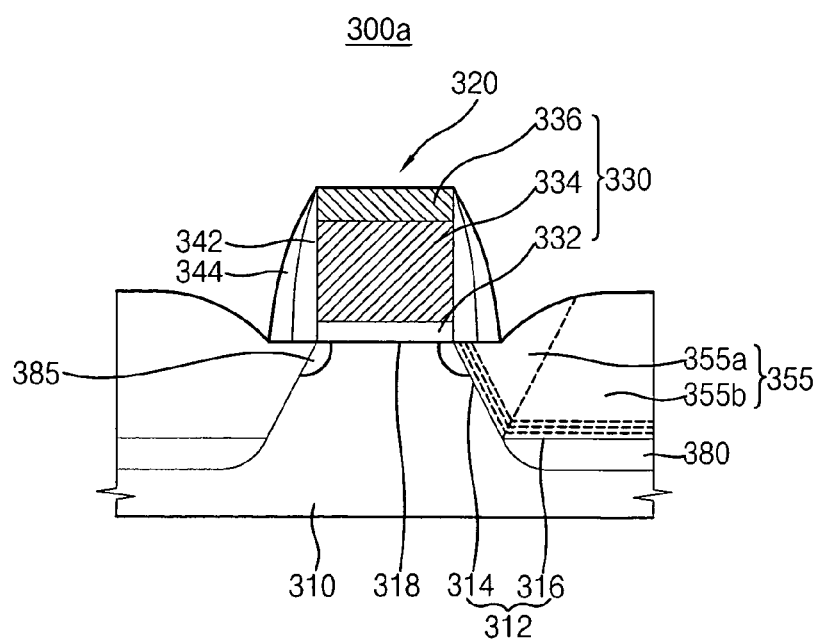
FIG. 62 is a cross sectional view illustrating a transistor in accordance with a fourteenth embodiment of the present invention.

FIG. 62 is a cross sectional view illustrating the transistor in accordance with the present embodiment.

Referring to FIG. 62, the elevated epitaxial layers 355 have surfaces higher than a surface 318 of a semiconductor substrate 310 as opposed to Embodiment 8, in which the epitaxial layers 350 have surfaces substantially identical to the surface 318 of the semiconductor substrate 310.

In the present embodiment, a method of manufacturing the transistor 300a is substantially identical to the above method described with reference to FIGS. 29 to 33 except for a process for forming the elevated epitaxial layers 355.

Referring now to FIG. 62, a source gas containing silicon-germanium, for example, a gas including $GeH_4$, $SiH_4$ or $SiH_2Cl_2$ is introduced onto recesses 312 for a relatively long time in comparison with Embodiment 8. Silicon-germanium epitaxially grows from the side faces 314 and the bottom faces 316 of the recesses 312 so that the elevated epitaxial layers 355 are formed to fill up the recesses 312, and are upwardly extended. Each of the elevated epitaxial layers 355 has a hetero structure in which a first crystalline structure 355a grows from the side face 314 in the [111] direction, and a second crystalline structure 355b grows from the bottom face 316 in the [100] direction. Also, the elevated epitaxial layers 355 have the surfaces higher than the surface 318 of the semiconductor substrate 310.

Alternatively, the source gas containing silicon-germanium and the third impurities including carbon, boron or phosphorous may be simultaneously introduced onto the recesses 312 to thereby form the elevated epitaxial layers 355 doped with the third impurities.

As a result, the transistor 300a is formed on the substrate 310 to include the second heavily doped impurity regions that have boundaries substantially corresponding to the side faces of the elevated epitaxial layers 355. The second heavily doped impurity regions may correspond to source/drain regions of the transistor 300a.

Alternatively, after the elevated epitaxial layers 355 are formed without doping the third impurities therein as described above, the third impurities are implanted into the elevated epitaxial layer 355 to thereby form elevated impurity regions corresponding to source/drain regions.

Embodiment 15

A transistor 300b of a fifteenth embodiment of the present invention includes elements substantially identical to those of the transistor 300 in Embodiment 8 except for a gate structure 320b. Thus, any further detailed description concerning the transistor of the present embodiment will not be repeated.

Figure 63:
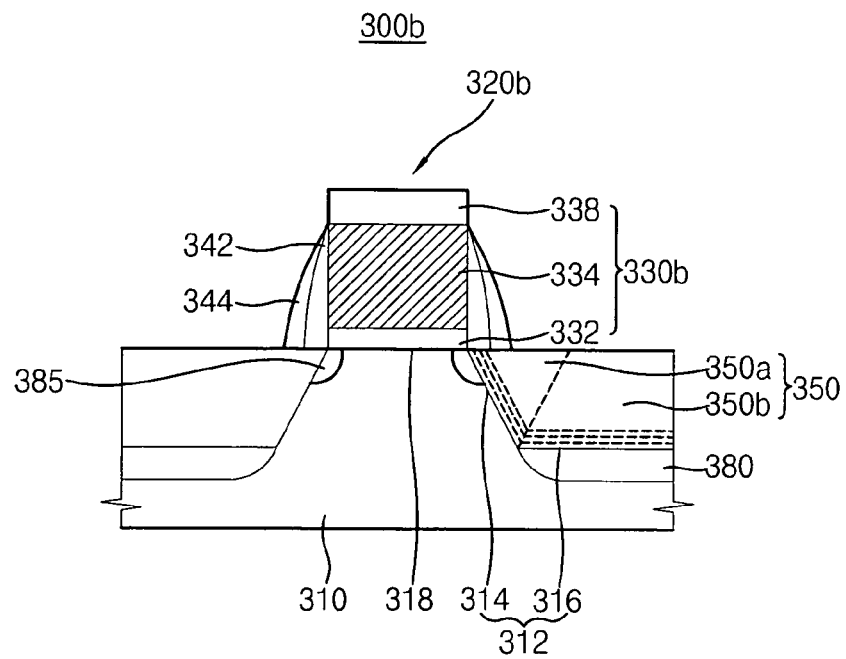
FIG. 63 is a cross sectional view illustrating a transistor in accordance with a fifteenth embodiment of the present invention.

FIG. 63 is a cross sectional view illustrating the transistor 300b in accordance with the present embodiment.

Referring to FIG. 63, the transistor 300b of the present embodiment includes a semiconductor substrate 310, a gate structure 320b formed on the semiconductor substrate 310, two epitaxial layers 350 formed at both sides of the gate structure 320b, lightly doped impurity regions 385 formed at side portions of the epitaxial layers 350, first heavily doped impurity regions 380 formed under the epitaxial layers 350, and second heavily doped impurity regions formed in the epitaxial layers 350.

The gate structure 320b includes a gate pattern 330b formed on the first surface 318 of the semiconductor substrate 310, and spacing members formed on a sidewall of the gate pattern 330b. The gate pattern 330b includes a gate insulation layer pattern 332 formed on the first surface 318 of the semiconductor substrate 310, a conductive layer pattern 334 formed on the gate insulation layer pattern 332, and an epitaxial gate layer 338 formed on the conductive layer pattern 334.

Here, the epitaxial gate layer 338 grows together with the epitaxial layers 350. Thus, the epitaxial gate layer 338 includes material substantially identical to that of the epitaxial layers 350.

In the present embodiment, the transistor 300b of the present embodiment includes the lightly doped impurity regions 385 and the first heavily doped impurity regions 380. Alternatively, the lightly doped impurity regions 385 and the first heavily doped impurity regions 380 may not be employed in the transistor 300b of the present embodiment.

FIGS. 64 to 69 are cross sectional views illustrating a method of manufacturing the transistor 300b in FIG. 63.

Figure 64:
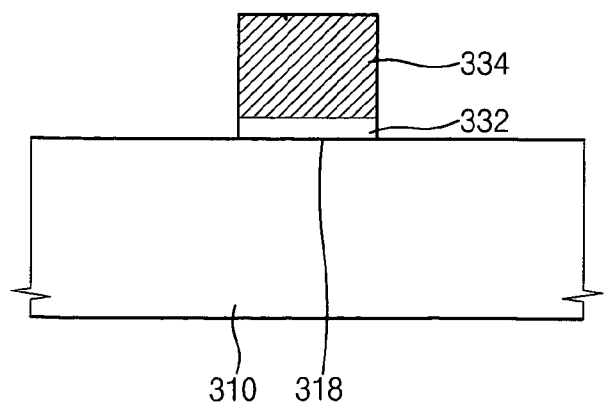
FIGS. 64 to 69 are cross sectional views illustrating a method of forming the transistor in FIG. 63.

Referring to FIG. 64, an insulation layer (not shown) such as an oxide layer is formed on the first surface 318 on the semiconductor substrate 310. A conductive layer (not shown) such as a metal, for example, tungsten, is formed on the insulation layer. A photoresist pattern (not shown) is formed on the conductive layer. The conductive layer and the insulation layer are partially etched using the photoresist pattern as an etching mask to form the gate insulation layer pattern 332 and the conductive layer pattern 334.

Figure 65:
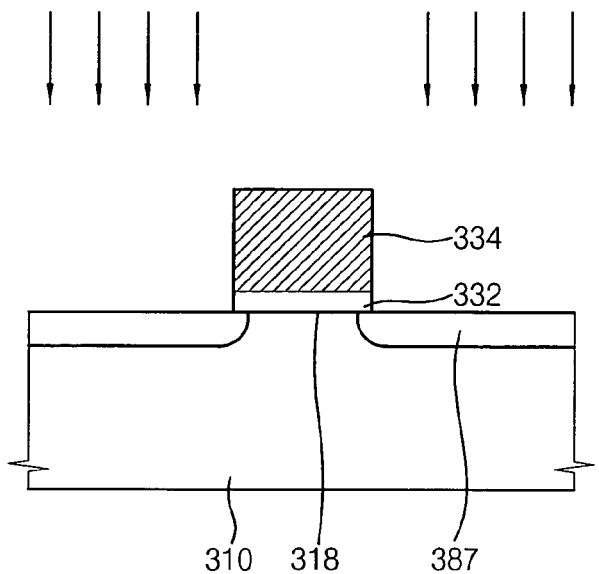

Referring to FIG. 65, first impurities are implanted into the surface 318 of the semiconductor substrate 310 using the conductive layer pattern 334 as an ion implantation mask to form preliminary lightly doped impurity regions 387 having a first concentration.

Figure 66:
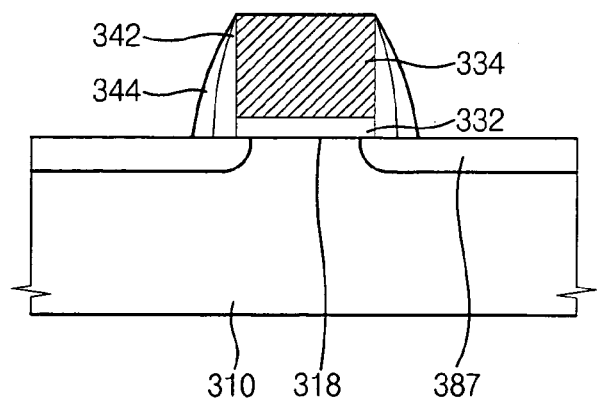

Referring to FIG. 66, a first silicon nitride layer (not shown) is formed on the gate insulation layer pattern 332, the conductive layer pattern 334 and the semiconductor substrate 310. The first silicon nitride layer is partially etched to form the first spacers 342 on the sidewalls of the conductive layer pattern 334. A second silicon nitride layer (not shown) is formed on the conductive layer pattern 334, the first spacers 342 and the semiconductor substrate 310. The second silicon nitride layer is partially etched to form the second spacers 344 on the first spacers 342, respectively.

Figure 67:
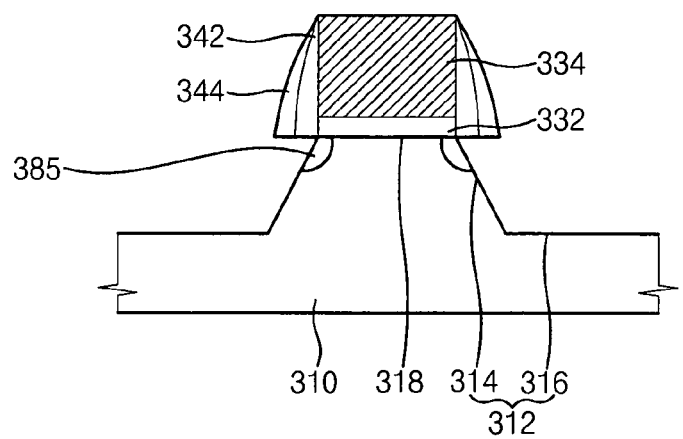

Referring to FIG. 67, portions of the surface 318 adjacent to both sides of the conductive layer pattern 334 are etched to form the recesses 312 at the portions of the surface 318. The recesses 312 may be formed by a dry etching process using an etching gas. The etching gas may include HCl and one of $GeH_4$, $SiH_4$ and $SiH_2Cl_2$. The dry etching process for forming the recesses 312 may be carried out under etching conditions substantially identical to those described in Embodiment 8.

The recesses 312 have side faces 314 of the {111} crystal plane and bottom faces 316 of the {100} crystal plane. When the recesses 312 are formed by partially etching the substrate 310, the preliminary lightly doped impurity regions 387 are partially removed to form the lightly doped impurity regions 385. Here, bottom faces of the first and second spacers 342 and 344 are exposed through the recesses 312.

Figure 68:
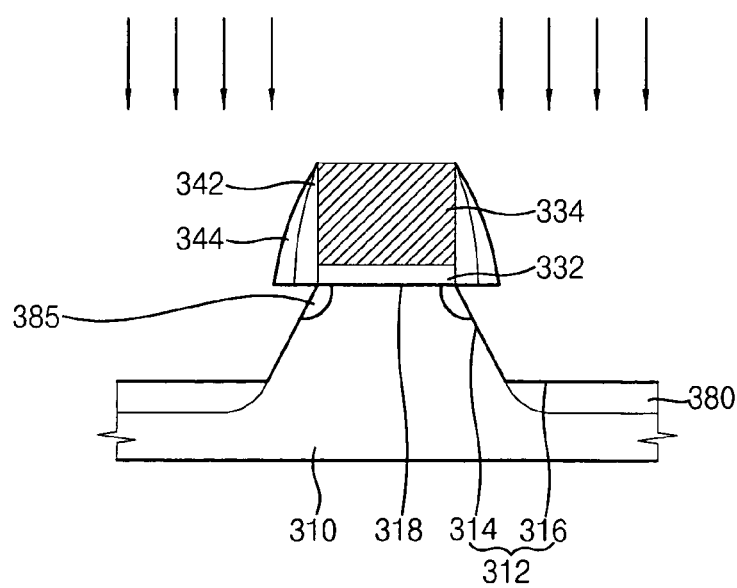

Referring to FIG. 68, second impurities are implanted into the bottom faces 316 of the recesses 312 to form the first heavily doped impurity regions 380 having a second concentration higher than the first concentration. Examples of the second impurities include carbon, boron, phosphorous, etc.

Figure 69:
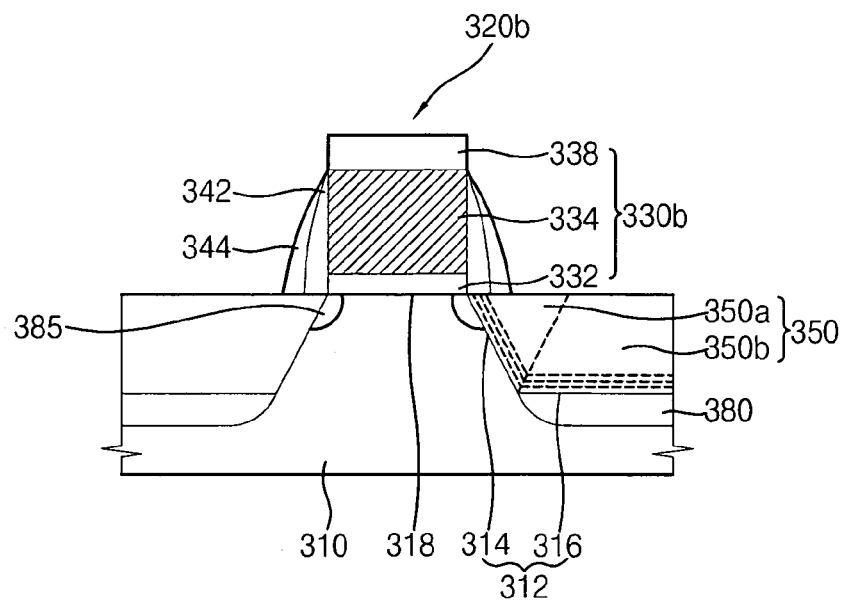

Referring to FIG. 69, a source gas containing silicon-germanium is introduced onto the recesses 312. Silicon-germanium epitaxially grows from the side faces 314 and the bottom faces 316 of the recesses 312 to thereby form the epitaxial layers 350 in the recesses 312, respectively. Simultaneously, silicon-germanium grows from a surface of the conductive layer pattern 334 to form the epitaxial gate layer 338 on the conductive layer pattern 334, thereby completing the gate pattern 330b including the gate insulation layer pattern 332, the conductive layer pattern 334 and the epitaxial gate layer 338 sequentially stacked. As a result, the gate structure 320b including the gate pattern 330b and the first and second spacers 342 and 344 is completed.

The source gas containing silicon-germanium and the third impurities including carbon, boron or phosphorous may be simultaneously introduced onto the recesses 312 to thereby form the epitaxial layers 350 doped with the third impurities. Thus, source/drain regions corresponding to the first heavily doped impurity regions 380 and the second heavily doped impurity regions are formed at both sides of the gate structure 320b. As a result, the transistor 300b is formed on the substrate 310 to include the second heavily doped impurity regions that have boundaries substantially corresponding to the side faces of the elevated epitaxial layers 355.

Manufacturing Transistors

Manufacturing a Transistor in Accordance with Embodiment 15

The transistor 300b in FIG. 63 in accordance with the method illustrated with reference to FIGS. 64 to 68 was manufactured. In particular, the gate insulation layer 332 and the conductive layer were sequentially formed on the first surface of the {100} crystal plane of the semiconductor substrate 310. The conductive layer was partially etched to form the conductive layer pattern 334. The first impurities were implanted into the semiconductor substrate 310 using the conductive layer pattern 334 as an ion implantation mask to form the preliminary lightly doped impurity regions 387. The first and second spacers 342 and 344 were sequentially formed on the sidewall of the conductive layer pattern 334. Portions of the semiconductor substrate 310 at both sides of the conductive layer pattern 334 were partially etched to form the recesses 312 having the side faces 314 of the {111} crystal plane and the bottom faces 316 of the {100} crystal plane. Simultaneously, the preliminary lightly doped impurity regions 387 were partially removed to form the lightly doped impurity regions 385. The second impurities were implanted into the bottom faces 316 of the recesses 312 to form the first heavily doped impurity regions 380. Silicon-germanium was introduced onto the semiconductor substrate 310. Silicon-germanium grew from the side faces 314 and the bottom faces 316 of the recesses 312 and the surface of the conductive layer pattern 334 to form the epitaxial layers 350 and the epitaxial gate layer 338. The third impurities were implanted into the epitaxial layers 350 to form the second heavily doped impurity regions.

Comparative Example 1

Figure 70:
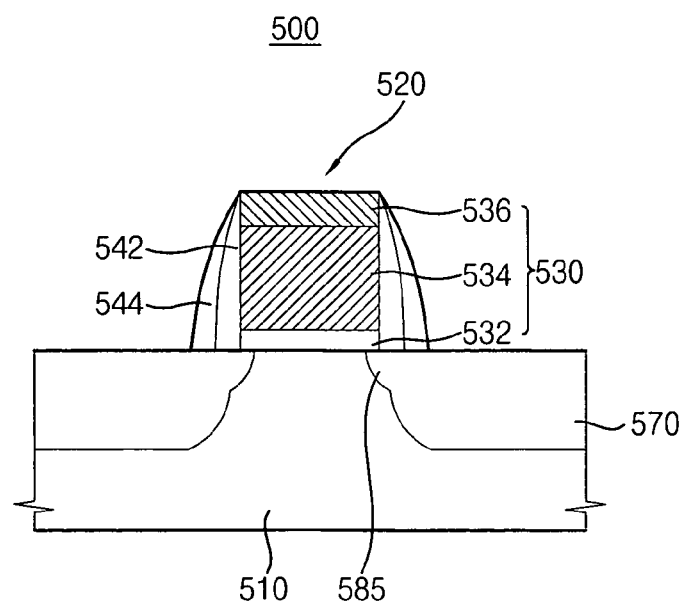
FIG. 70 is a cross sectional view illustrating a transistor in accordance with Comparative Example 1.

FIG. 70 is a cross sectional view illustrating a transistor 500 in accordance with Comparative Example 1. With reference to FIG. 70, the transistor 500 includes a semiconductor substrate 510, a gate structure 520 formed on the semiconductor substrate 510, heavily doped impurity regions 570 formed at both sides of the gate structure 520, and lightly doped impurity regions 585 formed at side portions of the heavily doped impurity regions 570.

The transistor 500 in FIG. 70 was manufactured as Comparative Example 1. In particular, a gate insulation layer 532, a conductive layer and a hard mask layer were sequentially formed on the semiconductor substrate 510. The conductive layer and the hard mask layer were partially etched to form a gate pattern 530 including the gate insulation layer 532, a conductive layer pattern 534, and a hard mask layer pattern 536 sequentially stacked. First impurities were implanted into the semiconductor substrate 510 using the gate pattern 530 as an ion implantation mask to form the lightly doped impurity regions 585. First and second spacers 542 and 544 were sequentially formed on a sidewall of the gate pattern 530 to form the gate structure 520. Second impurities were implanted into the semiconductor substrate 510 to form the heavily doped impurity regions 570, thereby completing the transistor 500 of Comparative Example 1.

Comparative Example 2

Figure 71:
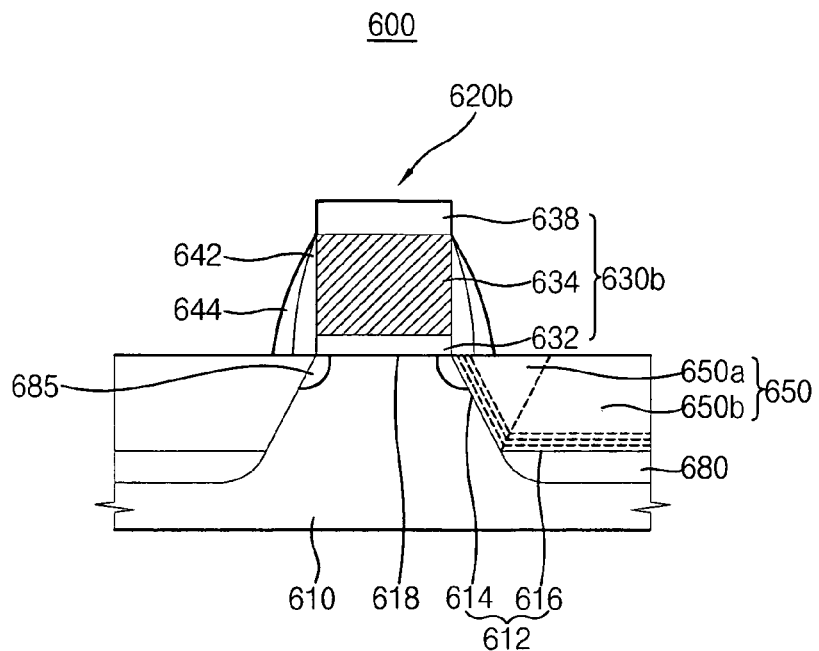
FIG. 71 is a cross sectional view illustrating a transistor in accordance with Comparative Example 2.

FIG. 71 is a cross sectional view illustrating a transistor 600 in accordance with Comparative Example 2. The transistor 600 includes elements substantially identical to those of the transistor in FIG. 63 except for a method of manufacturing the transistor 600 being different from that of the transistor in FIG. 63. Thus, any further illustrations with respect to the transistor 600 in FIG. 71 are omitted herein.

The transistor 600 in FIG. 71 was manufactured as Comparative Example 2. In particular, a gate insulation layer 632 and the conductive layer were sequentially formed on a first surface 618 of the {100} crystal plane of a semiconductor substrate 610. The conductive layer was partially etched to form a conductive layer pattern 634. First impurities were implanted into the semiconductor substrate 610 using the conductive layer pattern 634 as an ion implantation mask to form preliminary lightly doped impurity regions. First and second spacers 642 and 644 were sequentially formed on a sidewall of the conductive layer pattern 634. Second impurities were implanted into the semiconductor substrate 610 to form first preliminary heavily doped impurity regions. Portions of the semiconductor substrate 610 at both sides of the conductive layer pattern 634 were partially etched to form the recesses 612 having the side faces 614 of the {111} crystal plane and the bottom faces 616 of the {100} crystal plane. Simultaneously, the preliminary lightly doped impurity regions and the first preliminary heavily doped impurity regions were partially removed to form lightly doped impurity regions 685 and first heavily doped impurity regions 680. Silicon-germanium was introduced onto the semiconductor substrate 610. Silicon-germanium grew from the side faces 614 and the bottom faces 616 of the recesses 612 and the surface of the conductive layer pattern 634 to form the epitaxial layers 650 and the epitaxial gate layer 638. Third impurities were implanted into the epitaxial layers 650 to form second heavily doped impurity regions.

Measuring Junction Leakage Current and Drive Current Gains

Figure 72:
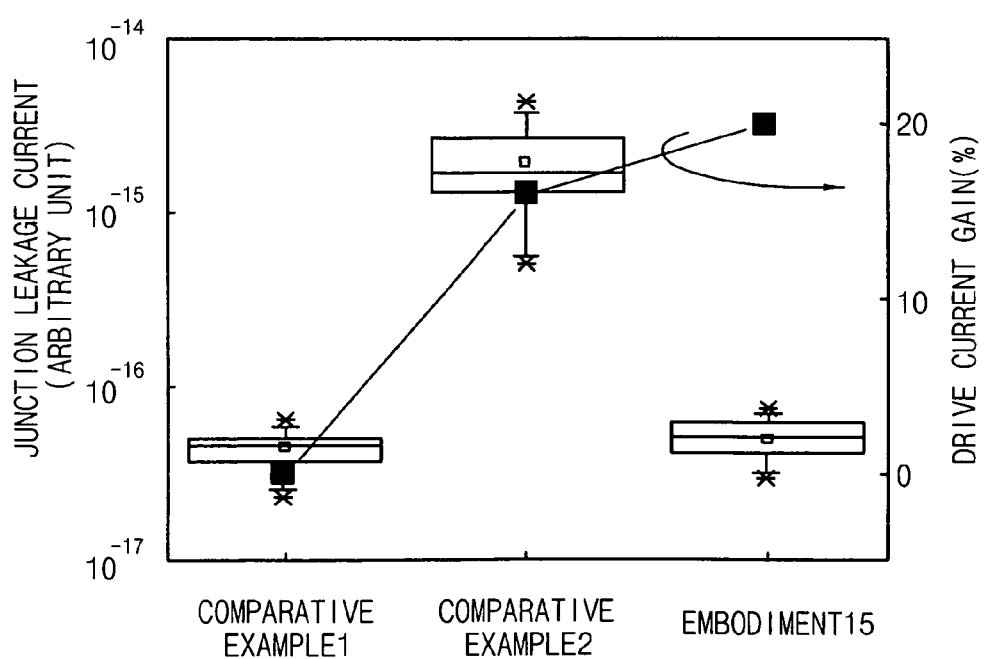
FIG. 72 is a graph illustrating junction leakage currents of Embodiment 15 and Comparative Examples 1 and 2, respectively.

Junction leakage currents and drive current gains with respect to the transistors of Embodiment 15 and Comparative Examples 1 and 2 were measured. The measured junction leakage current and drive current gains were shown in a graph of FIG. 72. In FIG. 72, a horizontal axis represented Embodiment 15, and Comparative Examples 1 and 2, a left vertical axis indicated the junction leakage current (arbitrary unit), and a right vertical axis represented the drive current gain (%). Also, relatively large rectangles in which horizontal dividing lines were drawn represent the junction leakage currents, and a graph ■ indicates the drive current gains.

Several junction leakage currents were measured. In the junction leakage current, a horizontal upper line and a horizontal lower line of the rectangles represent 25% value and 75% value, respectively. Also, the dividing line indicate a medium value. Further, each * located over and under the rectangles represent a maximum value and a minimum value, respectively. Two small lines near each * represent 5% value and 95% value, respectively. Small squares □ in the rectangles indicated an average value.

The drive current gain represented improved results obtained by measuring a quantity of the current. In particular, the drive current gain was shown based on a drive current gain of the transistor of Comparative Example 1 as a reference value of 0%. The more the drive current gain was increased, the more the quantity of the current was increased. This meant excellent effects of an ion implantation.

As shown in FIG. 72, each transistor of Embodiment 15 and Comparative Example 1 had a junction leakage current of no more than $10^{-16}$. In contrast, the transistor of Comparative Example 2 had a junction leakage current of no less than $10^{-16}$. That is, a relatively large junction leakage current was generated in the transistor of Comparative Example 2 including the recesses that were formed after forming the first impurity regions. In contrast, a junction leakage current smaller than that of transistor in Comparative Example 2 was generated in the transistor of Embodiment 15 including the recesses that were formed before forming the first impurity regions. Thus, it should be noted that the transistor of Embodiment 15 in accordance with the present invention had a reduced junction leakage current.

Also, in view of the drive current gain, the transistor of Comparative Example 2 had the drive current gain of about 15% compared to that of the transistor in Comparative Example 1. In contrast, the transistor of Embodiment 15 had the drive current gain of about 20% compared to that of the transistor in Comparative Example 1.

Therefore, although the transistor of Comparative Example 2 had the improved drive current gain compared to that of the transistor in Comparative Example 1, the transistor of Comparative Example 2 had a large junction leakage current. Although the transistor of Embodiment 15 had the junction leakage current substantially similar to that of the transistor in Comparative Example 1, the transistor of Embodiment 15 had the improved drive current gain compared to those of the transistors in Comparative Examples 1 and 2.

Measuring Turn-on Currents and a Turn-Off Currents

Figure 73:
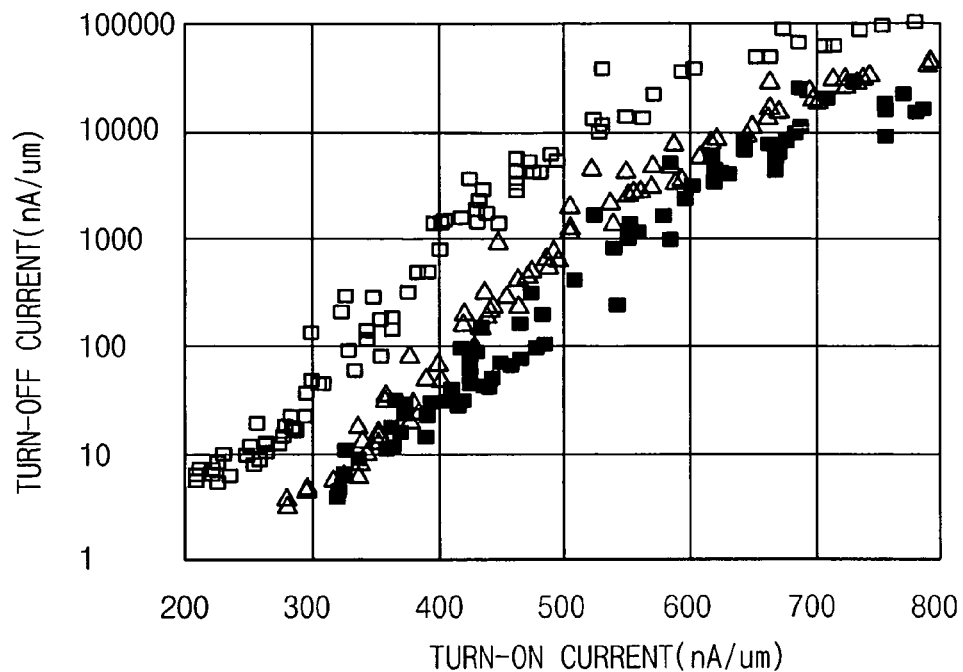
FIG. 73 is a graph illustrating turn-on currents and turn-off currents of Embodiment 15 and Comparative Examples 1 and 2, respectively.

Turn-on currents and turn-off currents with respect to the transistors of Embodiment 15 and Comparative Examples 1 and 2 were measured. The measured turn-on currents and turn-off currents are shown in FIG. 73. In FIG. 73, a horizontal axis represents the turn-on current, and a vertical axis indicates the turn-off current. Also, □ represents a current of the transistor in accordance with Comparative Example 1, Δ indicates a current of the transistor in accordance with Comparative Example 2, and ■ represents a current of the transistor in accordance with Embodiment 15.

As shown in FIG. 73, the higher the ratio of the turn-on current with respect to the turn-off current was, the more the operational reliability of the transistor was improved. When a substantially similar turn-off current was applied to the transistors, the transistor of Embodiment 15 had the highest turn-on current and the transistor of Comparative Example 1 had the lowest turn-on current. Thus, it may be noted that the transistor of the present invention had improved operational reliability.

Measuring Threshold Voltages

Figure 74:
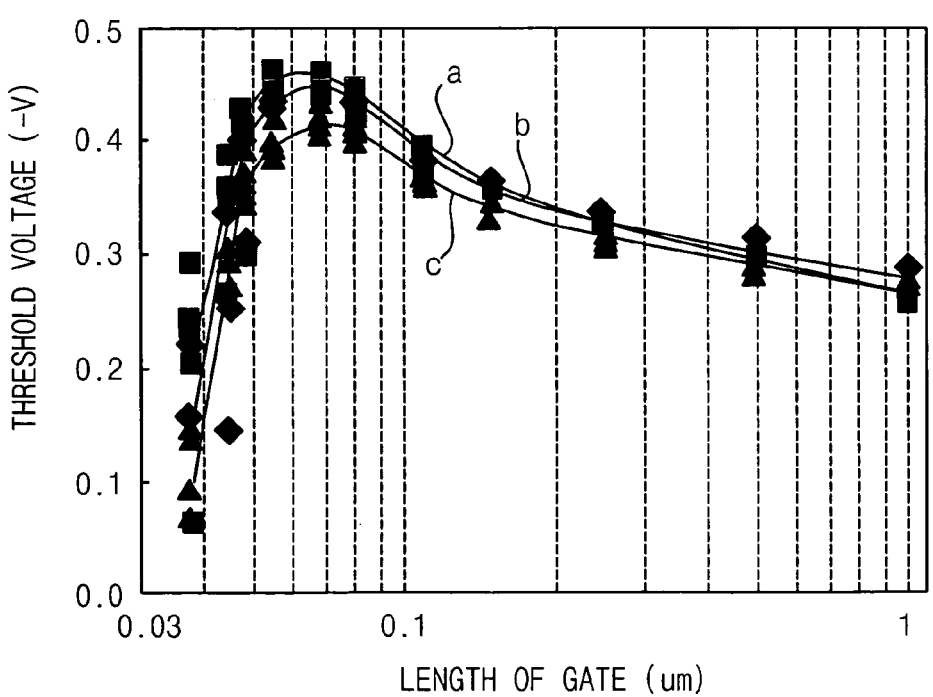
FIG. 74 is a graph illustrating threshold voltages of Embodiment 15 and Comparative Examples 1 and 2, respectively.

Threshold voltages with respect to the transistors of Embodiment 15 and Comparative Examples 1 and 2 were measured. The measured threshold voltages are shown in FIG. 74. In FIG. 74, a horizontal axis represents a length of a gate, and a vertical axis indicates a threshold voltage. Also, a line 'a' represents a threshold voltage of the transistor in Embodiment 15, a line 'b' indicates a threshold voltage of the transistor in Comparative Example 1, and a line 'c' represents a threshold voltage of the transistor in Comparative Example 2.

As shown in FIG. 74, it can be noted that the transistor of Embodiment 15 had the threshold voltage higher than those of Comparative Examples 1 and 2 with respect to a substantially same length of the gate. Therefore, since the transistor of the present invention had the relatively high threshold voltage compared to those of the transistors in Comparative Examples 1 and 2, the transistor of the present invention had improved operational reliability.

According to the present invention, the epitaxial layers have hetero structures in which the first crystalline structures grow from the side faces of the {111} crystal plane in the [111] direction, and the second crystalline structures grow from the bottom faces of the {100} crystal plane in the [100] direction. Therefore, the impurity regions of the transistor may have the side faces of the {111} crystal plane so that a short channel effect generated between the impurity regions may be prevented.

Also, the transistor of the present invention may have a relatively low junction leakage current, a relatively high ratio of the turn-on current with respect to the turn-off current, and a relatively high threshold voltage so that the transistor of the present invention may have improved electrical characteristics.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A transistor comprising:
   a semiconductor substrate having a first surface of a {100} crystal plane, a second surface of the {100} crystal plane having a height lower than that of the first surface, and a third surface of a {111} crystal plane connecting the first surface to the second surface and disposed at an angle with respect to the first and second surfaces;
   first heavily doped impurity regions formed under the second surface;
   a gate structure formed on the first surface;
   a heterogeneous epitaxial layer formed on the second surface and the third surface, wherein the epitaxial layer comprises a first crystalline structure growing from the third surface of the {111} crystal plane in a [111] direction, and a second crystalline structure growing from the second surface of the {100} crystal plane in a [100] direction; and
   second heavily doped impurity regions formed adjacent to both sides of the gate structure and within the heterogeneous epitaxial layer to form a source region and a drain region in combination with the first heavily doped impurity regions,
   wherein the second heavily doped impurity regions comprise side faces between the third surface of the semiconductor substrate and a central portion of the gate structure.

2. The transistor of claim 1, further comprising lightly doped impurity regions formed under the third surface.

3. The transistor of claim 1, wherein the gate structure comprises:
   a gate insulation layer pattern formed on the first surface; and
   a conductive pattern formed on the gate insulation layer pattern.

4. The transistor of claim 3, further comprising a hard mask layer pattern formed on the conductive layer pattern.

5. The transistor of claim 3, further comprising an epitaxial gate layer formed on the conductive layer pattern.

6. The transistor of claim 5, wherein the epitaxial gate layer comprises silicon germanium.

7. The transistor of claim 3, further comprising first and second spacers sequentially formed on a sidewall of the conductive layer pattern.

8. The transistor of claim 7, wherein the third surface is positioned beneath the first and second spacers.

9. The transistor of claim 1, wherein the epitaxial layer comprises silicon-germanium.

10. The transistor of claim 1, wherein the second heavily doped impurity regions comprise side faces substantially corresponding to the third surface of the semiconductor substrate.

11. The transistor of claim 1, further comprising a halo implantation region formed at a portion of the semiconductor substrate adjacent to the third surface of the semiconductor substrate, the halo implantation region preventing impurities in the second heavily doped impurity regions from diffusing into the semiconductor substrate, and the halo implantation region having a conductivity type different from those of the second heavily doped impurity regions.

12. The transistor of claim 1, wherein the epitaxial layer comprises a surface higher than the first surface of the semiconductor substrate.

13. A transistor comprising:
   a semiconductor substrate having a first surface of a {100} crystal plane, a second surface of the {100} crystal plane having a height lower than that of the first surface, and a third surface of a {111} crystal plane connecting the first surface to the second surface and disposed at an angle with respect to the first and second surfaces;
   a gate structure formed on the first surface, the gate structure including a gate insulation layer formed on the first surface, a conductive layer pattern formed on the gate insulation layer, and an epitaxial gate layer formed on the conductive layer pattern;
   a heterogeneous epitaxial layer formed on the second surface and the third surface, wherein the epitaxial layer comprises a first crystalline structure growing from the third surface of the {111} crystal plane in the [111] direction, and a second crystalline structure growing from the second surface of the {100} crystal plane in the [100] direction; and
   heavily doped impurity regions formed adjacent to both sides of the gate structure and within the heterogeneous epitaxial layer to form a source region and a drain region, wherein the impurity regions comprise side faces between the third surface of the semiconductor substrate and a central portion of the gate structure.

14. The transistor of claim 13, wherein the gate structure further comprises first and second spacers sequentially formed on a sidewall of the conductive layer pattern.

15. The transistor of claim 14, wherein the third surface is positioned beneath the first and second spacers.

16. The transistor of claim 13, wherein the epitaxial layer comprises silicon-germanium.

17. The transistor of claim 13, wherein the impurity regions comprise side faces substantially corresponding to the third surface of the semiconductor substrate.

18. The transistor of claim 13, further comprising a halo implantation region formed at a portion of the semiconductor substrate adjacent to the third surface of the semiconductor substrate, the halo implantation region preventing impurities in the impurity regions from diffusing into the semiconductor substrate, and the halo implantation region having a conductivity type different from those of the impurity regions.

19. The transistor of claim 13, wherein the epitaxial layer comprises a surface higher than the first surface of the semiconductor substrate.

* * * * *